United States Patent [19]

Epsom et al.

[11] 4,442,416

[45] Apr. 10, 1984

[54] VARIABLE IMPEDANCE SYNTHESIS APPARATUS

[75] Inventors: Robert L. Epsom, Hanover Park; Paul H. Gailus, Chicago; Anthony P. van den Heuvel, Arlington Heights, all of Ill.

[73] Assignee: Motorola, Inc., Schaumburg, Ill.

[21] Appl. No.: 336,202

[22] Filed: Dec. 31, 1981

[51] Int. Cl.³ .............................................. H01P 1/00
[52] U.S. Cl. ...................................... 333/263; 333/109; 455/50
[58] Field of Search .................... 333/17 M, 33, 81 A, 333/253, 263, 1.1, 245, 109, 115, 116, 213

[56] References Cited

U.S. PATENT DOCUMENTS

| | | | |
|---|---|---|---|
| 3,453,564 | 7/1969 | Russell | 333/33 X |
| 3,491,314 | 1/1970 | White | 333/263 X |
| 4,301,432 | 11/1981 | Carlson et al. | 333/263 X |

Primary Examiner—Paul L. Gensler
Attorney, Agent, or Firm—Mark P. Kahler; Edward M. Roney; James W. Gillman

[57] ABSTRACT

A variable impedance synthesis circuit is provided for generating a selected impedance, whether real or complex, at a predetermined port. The variable impedance synthesis circuit exhibits the selected impedance in response to control signals applied thereto.

6 Claims, 14 Drawing Figures

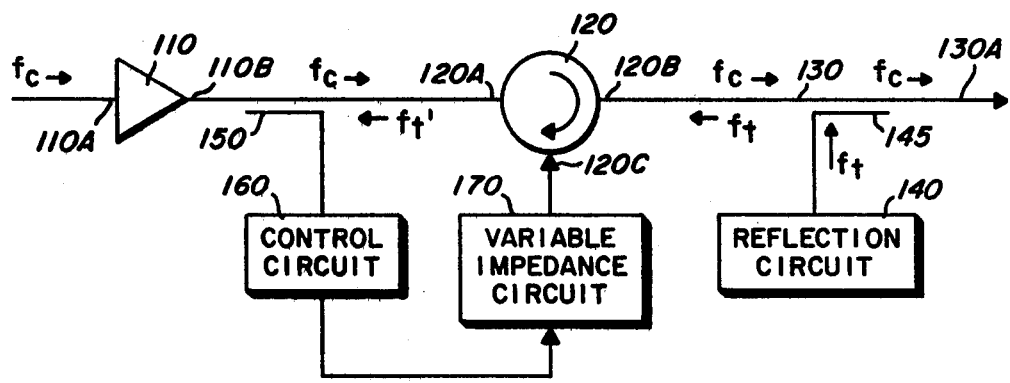
_Fig.4_
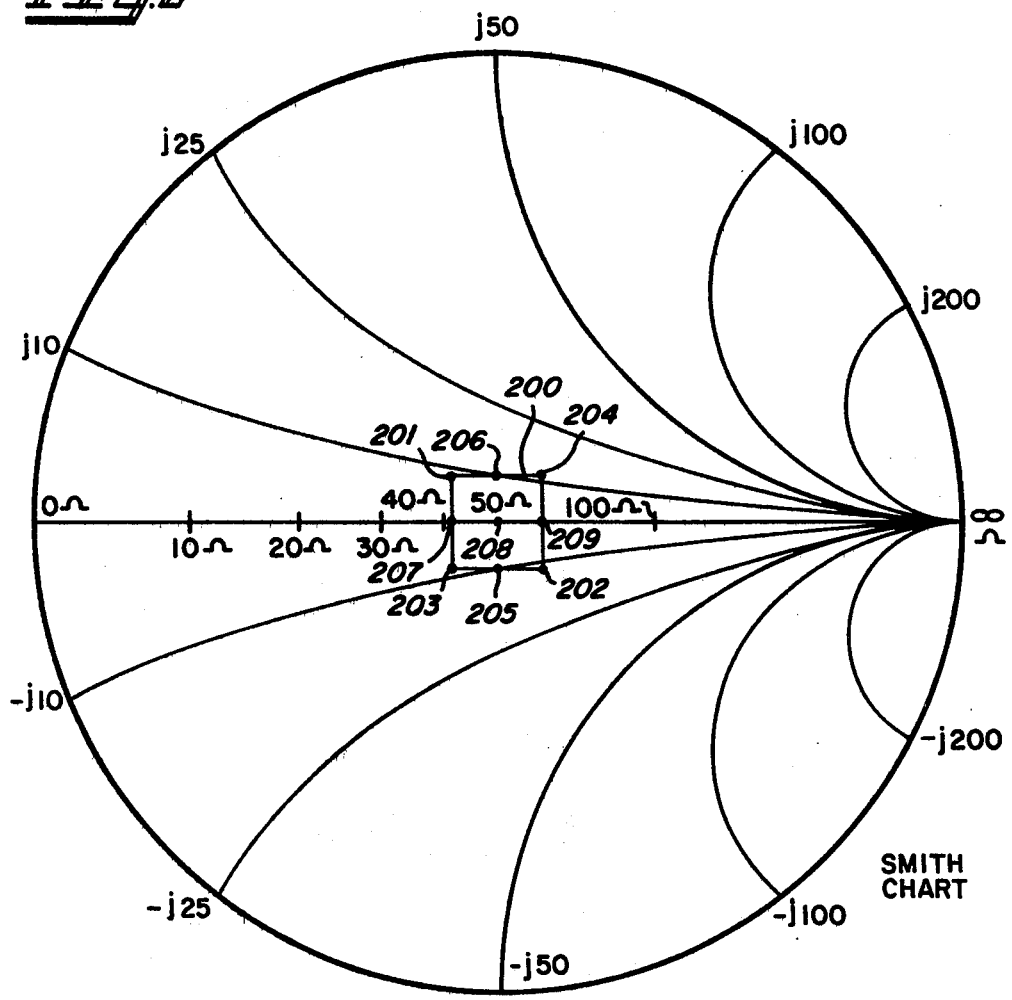
_Fig.6_
SMITH CHART

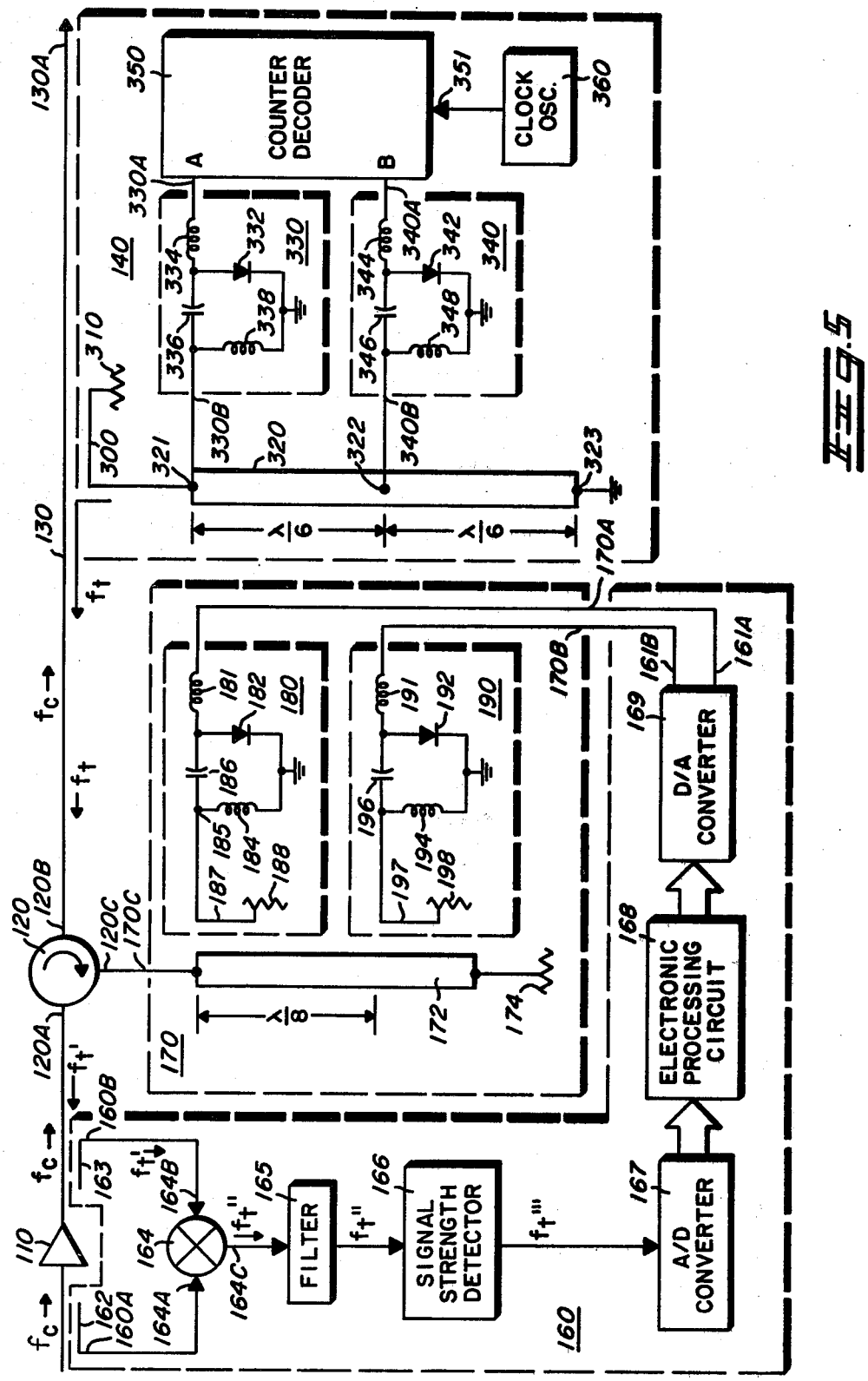

| $R_{182}$ | $R_{192}$ | $Z_{OUT}$ | POINT ON FIG.6 SMITH CHART |
|---|---|---|---|
| 0 Ω (ON) | 0 Ω (ON) | $40.2 + j8.2$ | 201 |
| ∞ Ω (OFF) | ∞ Ω (OFF) | $59.8 - j12.2$ | 202 |
| 0 Ω (ON) | ∞ Ω (OFF) | $40.2 - j8.2$ | 203 |
| ∞ Ω (OFF) | 0 Ω (ON) | $59.8 + j12.2$ | 204 |
| 50 Ω | ∞ Ω (OFF) | $49 - j9.9$ | 205 |
| 50 Ω | 0 Ω (ON) | $49 + j9.9$ | 206 |
| 0 Ω (ON) | 50 Ω | $40.9 Ω + j0$ | 207 |
| 50 Ω | 50 Ω | 50 Ω | 208 |
| ∞ Ω (OFF) | 50 Ω | $61.11 Ω + j0$ | 209 |
*Fig.7*
| STATE | A | B | P |
|---|---|---|---|
| 1 | 1 | 0 | 1 /180° |
| 2 | 0 | 1 | 1 /60° |
| 3 | 0 | 0 | 1 /−60° |
| 1 | 1 | 0 | 1 /180° |
| 2 | 0 | 1 | 1 /60° |
| 3 | 0 | 0 | 1 /−60° |
| ⋮ | ⋮ | ⋮ | ⋮ |
*Fig.9*
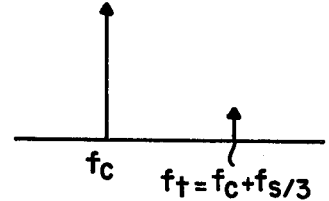
*Fig.10B*
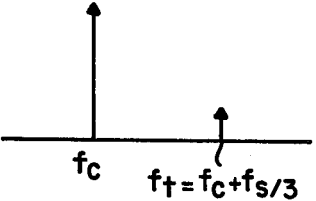
*Fig.10C*
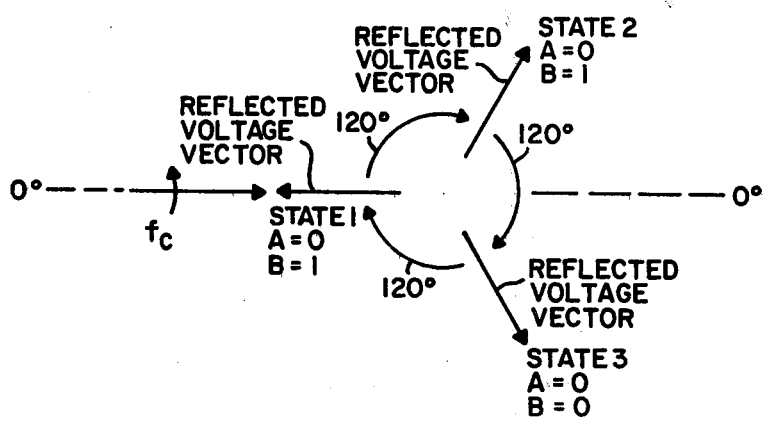
*Fig.10A*

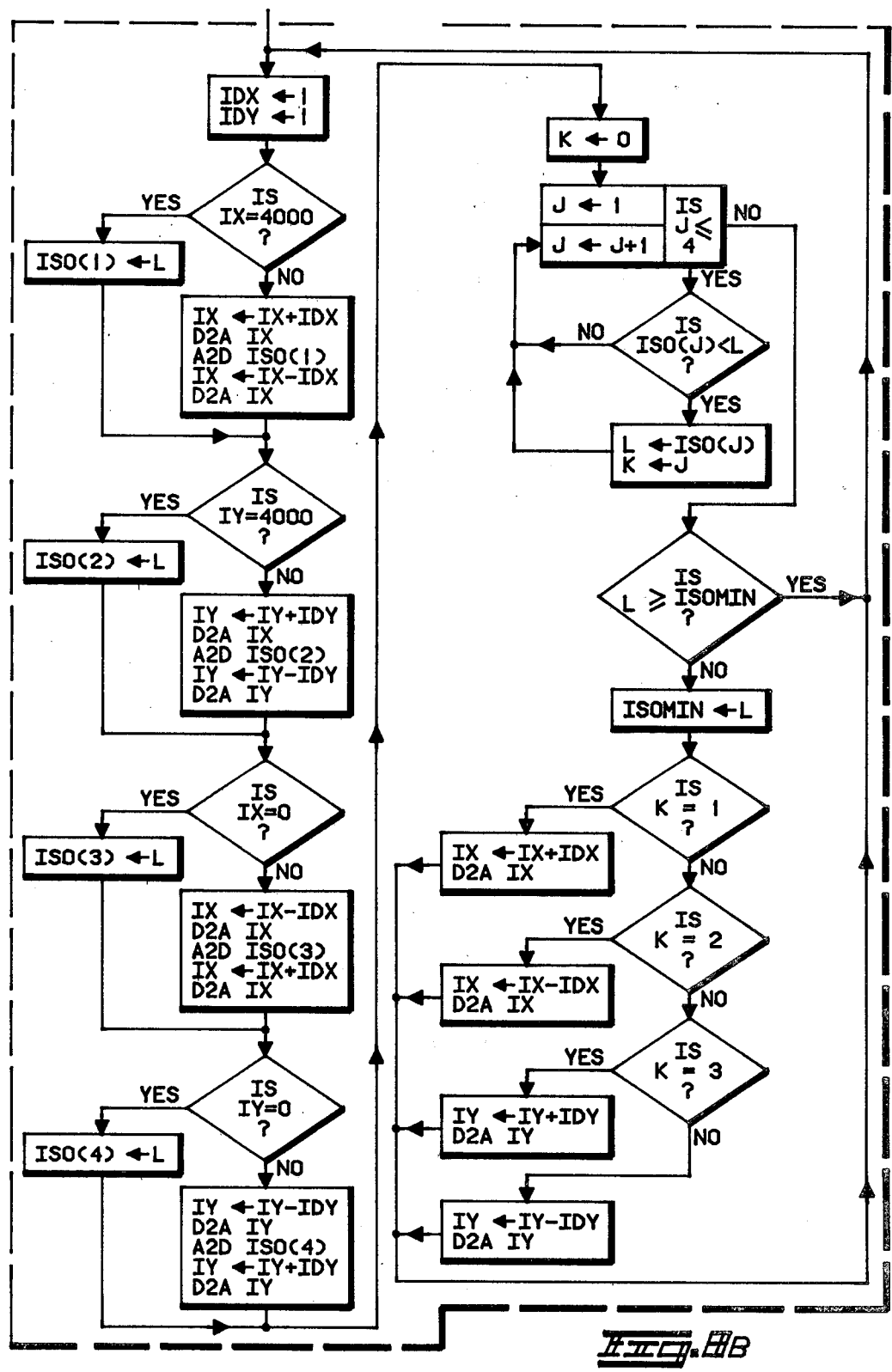

VARIABLE IMPEDANCE SYNTHESIS APPARATUS

BACKGROUND OF THE INVENTION

This invention relates in general to apparatus for reducing the amplitude of intermodulation products in radio frequency amplifiers coupled to circulators, and, more particularly, to a variable impedance synthesis circuit which in conjunction with associated circuitry may be coupled to such circulator to maximize the isolation from intermodulation products provided thereby.

DESCRIPTION OF THE PRIOR ART

Intermodulation is a problem often encountered in contemporary radio frequency power amplifiers. Such undesired intermodulation distortion products must be substantially attenuated or avoided by appropriate circuitry in order to prevent the generation of undesired spurious signals by radio frequency transmitters.

To illustrate and define the problem of intermodulation product generation in radio frequency power amplifiers, FIG. 1A shows a transmitter radio frequency power amplifier 10 which is amplifying or generating a radio frequency carrier signal exhibiting a frequency $f_c$ and its output as shown. The output of amplifier 10 is coupled to an antenna 20 such that the radio frequency carrier signal $f_c$ is radiated by antenna 20. As seen in FIG. 1A, amplifier 10 and antenna 20 are situated in close proximity to another antenna 30 which is radiating a radio frequency carrier signal exhibiting a frequency $f_1$. For purposes of discussion, $f_1$ is assumed to be greater than $f_c$ by an amount $\Delta f$. The frequencies $f_1$ and $f_c$ are relatively close to each other. Due to the relatively close proximity of antennas 20 and 30, the carrier signal $f_1$ from antenna 30 appears at amplifier 10 as well as the carrier frequency signal $f_c$. These two radio frequency carrier signals $f_c$ and $f_1$ interact at amplifier 10 and generate a first intermodulation distortion product exhibiting a frequency of $2f_c - f_1$ and a second intermodulation distortion product exhibiting a frequency of $2f_1 - f_c$.

The relationship in frequency between carrier signals $f_c$, $f_1$, and the first and second intermodulation products is shown in the amplitude versus frequency graph of FIG. 1B. It is noted that the amplitudes of the signals displayed in the FIG. 1B are not to scale. It is further noted, however, that the amplitude of the first intermodulation product at frequency $2f_c - f_1$ is substantial whereas the amplitude of the second intermodulation product at a frequency of $2f_1 - f_c$ is typically relatively small. The importance of substantially reducing the amplitude of the first intermodulation product is thus readily appreciated.

To reduce the amplitude of the first intermodulation product which appears at antenna 20 as an undesired output signal, a number of approaches have been employed in the past. One way to limit the amplitude of the first intermodulation product radiated by antenna 20 in conjunction with amplifier 10 is to take action to assure that the amplitude of the $f_1$ signal reaching antenna 20 is as small as possible. For example, separating antenna 20 and antenna 30 by a great distance may reduce the problem of intermodulation product generation. However, such a solution is impractical in the situation where antenna 20 and antenna 30 must be in relatively close proximity such as that of the common antenna site more colloquially known as the "antenna farm". Those skilled in the art, however, appreciate that limiting the amplitude of the $f_1$ signal reaching antenna 20 and amplifier 10 by definition limits or reduces the undesired intermodulation products.

One circuit for reducing the level of the $f_1$ signal reaching amplifier 10 is shown in FIG. 2. The circuit of FIG. 2 is similar to the circuit of FIG. 1A, except that radio frequency circulators 40 and 50 are situated in the signal path between the output of amplifier 10 and antenna 20 as shown. More specifically, circulator 40 includes an input port 40A, an output port 40B, and an isolation port 40C. Circulator 50 includes an input port 50A, an output port 50B, and an isolation port 50C. As seen in FIG. 2, the output of amplifier 10 is coupled to input port 40A such that the $f_c$ carrier signal is provided thereto, and the output port 40B is coupled to the input port 50A. Output port 50B is coupled to antenna 20. It is noted that it is the property of circulators such as circulators 40 and 50 that radio frequency energy flows through such circulators mostly in just one direction. More specifically, using circulator 50 as an example, a radio frequency signal provided to port 50A will travel to port 50B with essentially no attenuation. However, a radio frequency signal such as $f_1$ appearing at port 50B is coupled to isolation port 50C and is dissipated by a load resistor 60 coupled thereto as shown. Thus, undesired signals such as $f_1$ appearing at antenna 20 do not reach circulator input port 50A to a relatively large extent. A degree of isolation from intermodulation is thus achieved by employing circulator 50. Unfortunately, a single circulator such as circulator 50 typically does not provide sufficient isolation from intermodulation problems caused by the $f_1$ signal as is required. Thus, as shown in FIG. 2, another circulator 40 is cascaded with circulator 50 to in effect double the isolation in dB from the undesired $f_1$ signal. In summary, the $f_c$ desired signal generated at transmitter power amplifier 10 travels substantially unattenuated through circulators 40 and 50 to antenna 20, whereas the undesired $f_1$ off frequency signal from an adjacent antenna 30 is substantially isolated from amplifier 10 by circulators 40 and 50. Thus, the amplitude of intermodulation products generated at amplifier 10 and associated circuits coupled thereto is reduced.

It is noted that in order to achieve optimum isolation in the manner described above by circulators 40 and 50, it is imperative that load resistors 60 and 70, respectively coupled to isolation ports 50C and 40C exhibit an impedance as close to the characteristic impedance of circulators 50 and 40, respectively, as possible. In other words, if the circulator isolation ports 40C and 50C are terminated in the proper impedance, very high isolation from the undesired $f_1$ signal is obtained.

As many as four circulators have been cascaded together in the manner described above in order to achieve desired isolation from the $f_1$ signal and concurrent intermodulation product protection. Such a four circulator cascade arrangement is shown in FIG. 3 which includes circulator 80 and 90 having respective isolation ports coupled to appropriate termination impedances 85 and 95 as shown. Unfortunately, however, due to temperature variations, system VSWR changes, humidity and other effects, the guaranteed isolation of such cascaded circulators is limited to approximately 25 dB. Another problem with this prior cascaded circulator approach is the relatively high cost of each circulator. In the past, various impedance networks have been coupled from a circulator isolation port to ground in an attempt to achieve a high degree of isolation between the circulator output and the circulator input. Unfortunately, such prior impedance networks are undesirably affected by the temperature variation, system VSWR changes and other effects referred to above such that optimum circulator isolation was not achieved.

It is one object of the present invention to provide apparatus for maximizing the amount of isolation achieved by a radio frequency circulator.

Another object of the present invention is to provide apparatus which minimizes the amount of intermodulation distortion experienced by a radio frequency power amplifier.

Another object of the invention is to provide a variable impedance network capable of selectively synthesizing complex impedances which may be employed to achieve optimal circulator isolation.

These and other objects of the invention will become apparent to those skilled in the art upon consideration of the following description of the invention.

BRIEF SUMMARY OF THE INVENTION

The present invention is directed to a variable impedance network for providing a selectable impedance to a port. In accordance with one embodiment of the invention, the variable impedance network includes a transmission line having an input an an output for conducting radio frequency energy. The input of the transmission line is electrically coupled to the port. The output of the transmission line is electrically coupled to a predetermined characteristic impedance. A first variable resistance circuit is electrically coupled to the transmission line at a first coupling point. This first circuit varies the resistance presented to the transmission line at the first point in response to a first control signal. A second variable resistance circuit is electrically coupled to the transmission line at a second coupling point. The second resistance circuit varies the resistance presented to the transmission line at the second point in response to a second control signal. The second point is situated between the first point and the characteristic impedance at a sufficient distance from the first point such that signals reflected from the second resistance circuit are in quadrature relationship with respect to signals reflected from the first resistance circuit. Thus, impedances are selectively synthesized at the port in response to the first and second control signals.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DESCRIPTION OF THE DRAWINGS

FIG. 4 is a block diagram of apparatus for minimizing the generation of intermodulation products which employs the variable impedance synthesis apparatus of the present invention.

FIG. 5 is a detailed representation of the diagram of FIG. 4 more clearly showing the variable impedance synthesis apparatus of the present invention.

FIG. 6 is a Smith chart showing an impedance square including impedances which are synthesized in the circuit of FIG. 5.

FIG. 7 is a table of impedances plotted on the Smith chart of FIG. 6.

FIGS. 8A and 8B comprise a flow chart of one technique for determining the optimal impedance to be coupled to the isolation port of a circulator to achieve maximum isolation from intermodulation products therefrom.

FIG. 9 is a table showing the states and corresponding reflection coefficients generated by the reflection circuit of FIG. 5.

FIG. 10A is a representation of the reflected voltage vectors generated by the reflection circuit of FIG. 5.

FIG. 10B is a frequency spectrum graph of a carrier signal $f_c$ and a lower sideband signal $f_t$ generated by the action of the reflection circuit of FIG. 5.

FIG. 10C is a frequency spectrum graph of a carrier signal $f_c$ and an upper sideband signal $f_t$ generated by the action of the reflection circuit of FIG. 5.

DETAILED DESCRIPTION OF THE PREFERRED EMBODIMENT

Figure 1A:
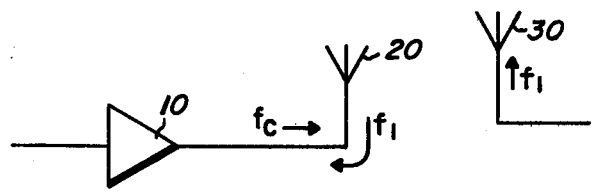
FIG. 1A is a schematic representation of an amplifier vulnerable to intermodulation from signals from a nearby antenna.
Figure 1B:
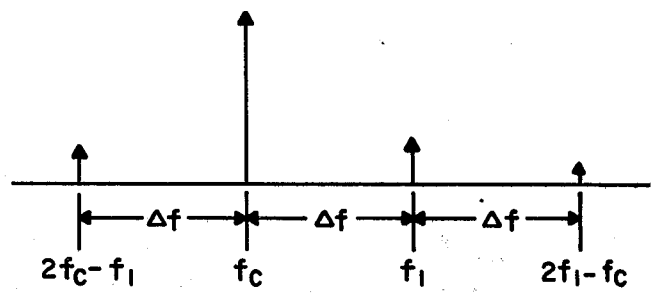
FIG. 1B is a frequency spectrum graph illustrating the problem of intermodulation.
Figure 2:
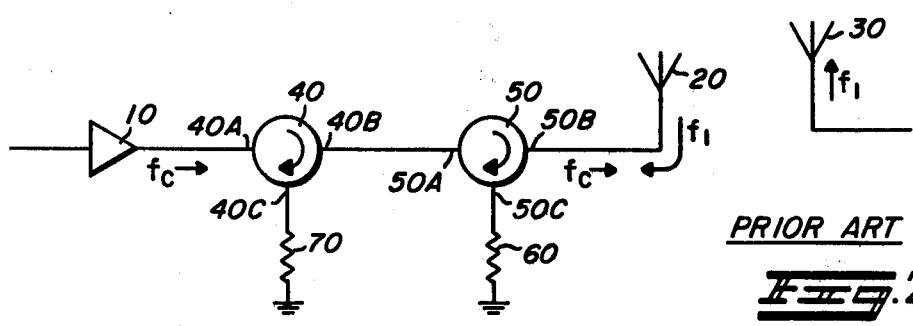
FIG. 2 is a schematic representation of one circuit employing cascaded circulators to inhibit the generation of intermodulation products.
Figure 3:
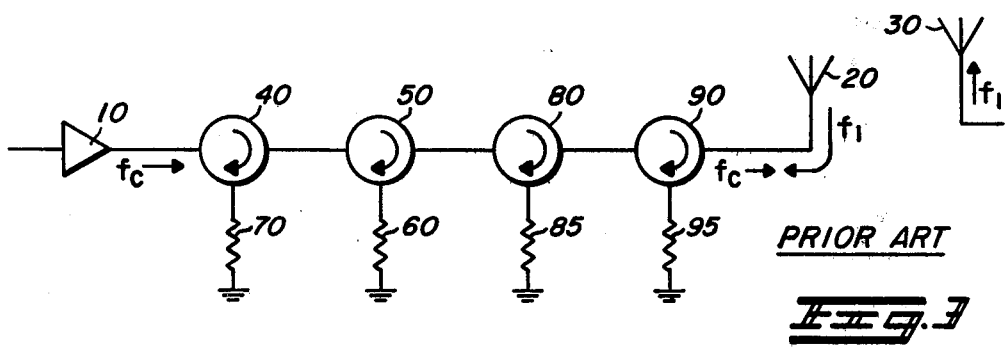
FIG. 3 is a schematic representation of another circuit employing cascaded circulators to inhibit the generation of intermodulation products.

FIG. 4 shows a block diagram of the adaptive radio frequency intermodulation minimizing apparatus of the present invention. The apparatus of FIG. 4 includes a radio frequency power amplifier 110, which includes an input 110A and an output 110B. Amplifier 110 amplifies radio frequency signals exhibiting a carrier frequency of $f_c$ which are provided to input 110A. The amplified carrier signal $f_c$ is generated at amplifier output 110B as seen in FIG. 4. Amplifier output 110B is coupled to an input port 120A of a radio frequency circulator 120. Circulator 120 further includes an output port 120B and an isolation port 120C. The carrier signal $f_c$ provided to circulator 120A is coupled through to circulator output 120B with substantially no attenuation. Circulator output 120B is electrically coupled to a transmission line 130 which constitutes the output of the apparatus of FIG. 4. It is thus seen that the carrier signal $f_c$ travels through such apparatus from amplifier input 110A to transmission line output 130A.

A reflection circuit 140 is coupled to transmission line 130 via a coupler 145 situated between circulator output 120B and transmission line output 130A. Reflection circuit 140 generates a radio frequency signal $f_t$ exhibiting characteristics distinguishable from carrier signal $f_c$. In one embodiment of the invention, reflection circuit 140 generates a signal $f_t$ comprised of sideband energy at a frequency somewhat above or somewhat below the frequency of carrier signal $f_c$. The frequency of the $f_t$ signal is sufficiently removed from the frequency of the $f_c$ signal so as to be distinguishable therefrom, for example, $f_t = f_c \pm 10$ kHz in one embodiment. The $f_t$ signal is generated so as to exhibit a relatively small amplitude and is coupled to transmission line 130 via coupler 145 in a loose manner such that the amplitude of $f_t$ is approximately 60 dB below the amplitude of the $f_c$ signal on transmission line 130, for example. Since the $f_t$ signal is distinguishable from the carrier signal $f_c$, the $f_t$ signal may be referred to as a "tag signal".

It is thus seen that the $f_t$ signal generated by reflection circuit 140 is launched toward circulator output 120B as shown by the arrows designating the signal flow path of $f_t$ in FIG. 4. Since the isolation provided by circulator 120 is not ideal, a portion of the $f_t$ signal provided to circulator output 120B reaches circulator input 120A, and is designated $f_t'$ as shown in FIG. 4. The amplitude of $f_t'$ exhibits indicia of the amount of isolation provided by circulator 120. More specifically, the lower the amplitude of $f_t'$ at circulator input 120A, the greater is the isolation from output to input provided by circulator 120 against undesired interfering signals such as the $f_1$ signal already discussed in the Description of the Prior Art. A coupler 150 is situated in the transmission line coupling amplifier output 110B to circulator input 120A such that both the carrier signal $f_c$ and the now attenuated $f_t'$ signal are provided to the input of a control circuit 160. Control circuit 160 separates the $f_t'$ signal (that is, the tag signal) from the $f_c$ carrier signal and generates a control signal therefrom exhibiting indicia of the amplitude of the $f_t'$ signal. Thus, the control signal generated at the output of control circuit 160 exhibits indicia of the amount of isolation provided by circulator 120. For example, in one embodiment of the invention, larger amounts of isolation provided by circulator 120 result in correspondingly smaller amplitude $f_t'$ signals reaching control circuit 160 and thus, under such conditions control circuit 160 generates a control signal with a correspondingly small DC amplitude proportional to the amplitude of the $f_t'$ signal. However, smaller amounts of isolation provided by circulator 120 result in correspondingly larger $f_t'$ signals reaching circulator input port 120A and control circuit 160 such that control circuit 160 generates a control signal having a DC level exhibiting a correspondingly larger amplitude proportional to the amplitude of the $f_t'$ signal. Thus, it is seen that the control signal generated by the control circuit 160 exhibits indicia of the amount of isolation provided by circulator 120. It is again stressed that the amount of isolation provided by circulator 120 is highly dependent upon the particular value of impedance provided to circulator isolation port 120C under the various continually varying ambient circuit operating conditions. The impedance provided to such isolation port 120C must be as closely equal to the somewhat unstable characterstic impedance of isolator 120 which changes with temperature, humidity and other operating conditions already discussed.

The output of control circuit 160 is coupled to the input of an electronically variable impedance circuit 170. The output of impedance circuit 170 is electrically coupled to the isolation port 120C of circulator 120. The control signal from control circuit 160 controls the impedance exhibited by impedance circuit 170 to isolation port 120C such that the appropriate impedance for impedance network 170 is always selected such that circulator 120 passes an optimally minimum $f_t°$ signal and thus achieves a maximum of isolation from output 120B to input 120A. For example, if the $f_t'$ signal was relatively large, control circuit 160 would generate a correspondingly large amplitude control signal. The amplitude of such control signal is varied until an appropriate impedance is selected for impedance circuit 170 which causes the $f_t'$ signal to be minimized and thus the isolation provided by circulator 120 to be maximized. Control circuit 160 and electronically variable impedance circuit 170 are discussed subsequently in more detail.

To aid in understanding the operation of the apparatus of the present invention, the electronically variable impedance circuit 170 is discussed prior to discussion of control circuit 160 which generates control signals to select the appropriate impedance to be exhibited by impedance circuit 170 to result in maximum circulator isolation.

FIG. 5 shows a more detailed block diagram of the apparatus of the present invention including one electronically variable impedance circuit 170 which may be employed for the purposes discussed above. More specifically, impedance circuit 170 includes an output port 170C at which the impedance present thereat is varied in accordance with control signals provided to inputs 170A and 170B of impedance circuit 170. It is noted that impedance circuit output 170C is coupled to the isolation port 120C of circulator 120 such that the impedance provided thereto can be selectively varied. Impedance circuit 170 includes a transmission line having one end electrically connected to impedance circuit output 170C and the remaining end coupled to a load resistor 174 exhibiting the characteristic impedance of the circuit element coupled to output 170C, here namely the characterstic impedance of circulator 120, 50 ohms for example.

Impedance circuit 170 includes a first variable impedance network 180. Impedance network 180 includes a variable resistance element, for example, a PIN diode 182, the resistance of which varies in proportion to the voltage applied across such resistance element. PIN diode 182 includes an anode coupled by an inductor 181 to impedance circuit input 170A such that voltage signals provided to impedance circuit input 170A cause the resistance exhibited by PIN diode 182 to vary. The cathode of PIN diode 182 is coupled to ground. An inductor-capacitor circuit comprised of inductor 184 and capacitor 186 connected together in series are together coupled in parallel with PIN diode 182 to cancel out the effects of any parasitic capacitance and inductance exhibited thereby. It is noted that a node 185 is formed at the juncture of inductor 184 and 186. Node 185 is electrically coupled to a coupler 187 which is coupled to transmission line 172 at the end of line 172 facing impedance circuit output 170C. In this embodiment of the invention, coupler 187 is selected to exhibit −10 dB of coupling. Thus, electrical signals which enter in circuit output 170C travel to coupler 187 and see an impedance related to the particular value of the impedance of PIN diode 182 selected by the control signal applied thereto via input 170A.

A second impedance network 190 substantially identical to impedance network 180 is coupled to transmission line 172 at a distance $\lambda/8$ ($\lambda$ is related to the operating frequency of power amplifier 110) from the point at which coupler 187 couples impedance network 180 to transmission line 172. More specifically, impedance network 190 includes an input 170B coupled to an inductor 191 analogous to inductor 181 of impedance network 180. Impedance network 190 further include a PIN diode 192, an inductor 194, a capacitor 196, and a coupler 197 all coupled together in the same manner as the respective elements diode 182, inductor 184, capacitor 186, and coupler 187 of impedance network 180. In this embodiment of the invention, coupler 197 is selected to exhibit slightly more coupling than coupler 187 to compensate for signal losses in coupler 187. For example, in this embodiment, coupler 197 exhibits −9.54 dB of coupling. It is noted that couplers 187 and 197 are respectively terminated in load resistors 188 and 198 typically exhibiting the characterstic impedance of the circulator 120 or other device coupled to impedance circuit output 170C.

To more fully understand the operation of impedance networks 180 and 190, it is instructive to examine the impedance exhibited by impedance circuit output 170C as the resistances of PIN diodes 182 and 192 are selectably varied according to control signals applied thereto via inputs 170A and 170B, respectively. The impedances which are capable of being synthesized by impedance circuit 170 include and form the boundaries of a square 200 when plotted on a Smith chart as shown in FIG. 6. The range of synthesizable impedances is directly related to the amount of coupling provided by couplers 187 and 197 and will be discussed later in more detail. For convenience, the Smith chart of FIG. 6 is normalized at 50 ohms. FIG. 7 is a chart showing selected resistances for diodes 182 and 192 and the corresponding impedance at impedance circuit output 170C which such resistance combinations cause to be generated. Again it is noted that the resistance exhibited by PIN diodes 182 and 192 are variable substantially from 0 ohms through ∞ ohms according to the magnitude of voltage bias supplied thereto via the control signals supplied to respective inputs 170A and 170B. $R_{182}$ and $R_{192}$ are respectively designated as the resistances exhibited by PIN diodes (resistance elements) 182 and 192 in the chart of FIG. 7. $Z_{OUT}$ designates the impedance exhibited by impedance circuit 170 at impedance circuit output 170C. The following four combinations of resistances values for diodes 182 and 192 result in four impedances $Z_{OUT}$ which designate the corners of the aforementioned square 200. More specifically, when diode 182 of impedance network 180 is appropriately biased so as to be turned on and exhibit a resistance of 0 ohms and while at the same time diode 192 of impedance network 190 is appropriately biased to be turned on to also exhibit a resistance of 0 ohms, then, as seen in the chart of FIG. 7, the impedance $Z_{OUT}$ exhibited an output 170C equals 40.2+j8.2 which is plotted at point 201 on the Smith chart of FIG. 6. Point 201 defines the left uppermost corner of the aforementioned square 200 of possible impedance values. It is noted that this combination of resistance values of diodes 182 and 192 yields an impedance which includes both a real component and a reactive component. When diode 182 is appropriately biased to be turned off and exhibits a resistance equal to ∞ ohms and while diode 192 is sumultaneously appropriately biased to be turned off and also exhibit a resistance of ∞ ohms, then the impedance $Z_{OUT}$ presented at output 170C is equal to 59.8−j12.2 and is designated as point 202 on the Smith chart of FIG. 6. Point 202 forms the lower right hand corner of impedance square 200. Again it is noted that a complex impedance, that is one exhibiting both a real part and an imaginary part, is synthesized by employing the immediately aforementioned values of resistance for diodes 182 and 192. When diode 182 is appropriately biased to be turned on so as to exhibit a resistance of 0 ohms and while diode 192 is simultaneously appropriately biased to be turned off to exhibit a resistance of ∞ ohms, the output impedance $Z_{OUT}$ exhibited an output 170C equals 40.2−j8.2, which impedance is designated as point 203 and is shown as such on the Smith chart of FIG. 6. Point 203 forms the lower left corner of the aforementioned impedance square 200. When diode 182 is appropriately biased to be in a turned off state so as to exhibit a resistance of ∞ ohms and while diode 192 is simultaneously appropriately biased to a turned on state so as to exhibit a resistance of 0 ohms, then the impedance $Z_{OUT}$ presented by impedance circuit 170 at impedance circuit 170 output C equals 59.8+j12.2, such impedance being designated point 204 and being plotted as such on the Smith chart of FIG. 6. Point 204 forms the upper right corner of the impedance square 200. On the Smith chart of FIG. 6, lines have been drawn connecting points 201, 204, 202, and 203 so as to form the substantially square geometry of impedance square 200. It is noted that the impedance represented by points 201, 202, 203, and 204 are synthesized by biasing diodes 182 and 192 to exhibit resistance of various combinations of 0 ohms and ∞ ohms. However, other impedances within the boundaries of impedance square 200 may also be synthesized by causing diodes 182 and 192 to exhibit impedances with values intermediate between 0 ohms and ∞ ohms. Examples of such cases will now be given in detail here. Virtually any impedance on the boundary of impedance square 200 or existing within such boundary may be synthesized by appropriately biasing diodes 182 and 192 to exhibit appropriate resistances which in turn generate the desired output impedance $Z_{OUT}$ at output 170C.

Referring again to the chart of FIG. 7, when diode 182 is appropriately biased to exhibit a resistance of 50 ohms and simultaneously diode 192 is appropriately biased to a turned off state to exhibit a resistance of ∞ ohms, then under these conditions $Z_{OUT}$ equals 49.0−j9.9 which impedance is designated at point 205 on the Smith chart of FIG. 6. Referring again to FIG. 7 in conjunction with FIG. 5, when diode 182 is appropriately biased to exhibit a resistance of 50 ohms and diode 192 is simultaneously appropriately biased to a turned on state so as to exhibit a resistance of 0 ohms, the impedance circuit 170 exhibits an output impedance $Z_{OUT}$ at output 170C equal to 49.0+j9.9, such impedance being designated point 206 on the Smith chart of FIG. 6.

In the prior two examples wherein impedances corresponding to points 205 and 206 are synthesized by impedance circuit 170, the synthesized impedance 205 and 206 are complex. However, consistent with the present invention, any impedance within the boundaries of impedance square 200 may be synthesized and, moreover, impedances which are substantially completely real (that is, not complex) may be synthesized. For example, when diode 182 is appropriately biased to a turned on state to exhibit a resistance of 0 ohms and simultaneously therewith diode 192 is appropriately biased to exhibit a resistance of 50 ohms, the output impedance of impedance circuit 170, $Z_{OUT}$ equals 40.9 ohms and is designated as point 207 on the real axis of the Smith chart of FIG. 6. Referring again to FIG. 7 in conjunction with FIG. 5, when diode 182 is appropriately biased to exhibit a resistance of 50 ohms and simultaneously therewith diode 192 is appropriately biased to exhibit a resistance also of 50 ohms, then the output impedance $Z_{OUT}$ equals 50 ohms which is designated as point 208 on the real axis of the Smith chart of FIG. 6. Referring once again to FIG. 7 in conjunction with FIG. 5, when diode 182 is appropriately biased to a turned off state so as to exhibit a resistance of ∞ ohms, and simultaneously therewith, diode 192 is appropriately biased to exhibit resistance of 50 ohms, then the utput impedance $Z_{OUT}$ of impedance network 170 equals 61.11 ohms, such impedance being designated point 209 on the real axis of the Smith chart of FIG. 6. Thus, it is seen that points 207, 208, and 209 exhibiting impedances which are completely real, namely respectively 40.9, 50, and 61.11 ohms, may be synthesized employing eletronically variable impedance circuit 170. If it is desired that electronically variable impedance circuit 170 should synthesize impedances having a wider range than that of the embodiment of the invention immediately discussed above (that is, if it is desired that impedance square 200 should occupy a greater portion of FIG. 6), then tighter coupling than the −10 dB employed in coupler 187 and the −9.54 dB employed in coupler 197 should be used. For example, employing −5 dB of coupling for coupler 187 and −3.35 dB for coupler 197 results in a range of real impedances of 28 ohms through 95 ohms being synthesized which corresponds to and is broader than the 40.9 through 61.11 ohms range of the 207 and 209 points discussed immediately above. If an even greater range of impedance values are desired to be synthesized by electronically variable impedance circuit 170, then even tighter coupling is employed for couplers 187 and 197. For example, if coupler 187 exhibits −3 dB of coupling and coupler 197 exhibits −0 dB of coupling, then impedance square 200 is enlarged to such an extent that real components of impedance ranging from 15 ohms to 200 ohms may be synthesized, for example. Of course, in the last two above discussed cases wherein the coupling of couplers 187 and 197 is tighter than the −10 dB and −9.54 dB, respectively, of the present embodiment of the invention, a wider range of complex impedances as well as real components may also be synthesized as compared with the present embodiment of the invention. Clearly, looser coupling for couplers 187 and 197 (for example, −20 dB and −19.96 dB, respectively) may be provided if it is desired to shrink the size of impedance square 200 such that a smaller range of complex or real impedances are capable of being synthesized.

In conclusion of the discussion of electronically variable impedance network 170, it is seen that virtually any impedance within impedance square 200 may be synthesized according to appropriate values of biased voltage applied to inputs 170A and 170B to select the desired output impedance $Z_{OUT}$. It is the purpose of the control circuit 160 which will now be discussed to provide such appropriate control signals (control voltages or bias voltages) which will select an impedance for electronically variable impedance network 170 which will match the somewhat variable impedance of circulator 120 so as to maximize the isolation provided by circulator 120 from undesired radio frequency signals $f_1$ entering circulator port 120B and potentially passing through to circulator port 120A.

For purposes of the subsequent discussion of control circuit 160, it is assumed that the reflection circuit 140 (discussed later in full detail) generates a tag signal, $f_t$, having a frequency equal to $f_c - 10$ kHz. The $f_t$ signal which is relatively weak compared to the $f_c$ carrier signal (for example, 60 dB below the $f_c$ signal) travels through circulator 120 from output port 120B to input port 120A at which point it is designated the $f_t'$ signal after being attenuated by circulator 120. The $f_t'$ signal is provided to an input of control circuit 160 of FIG. 5 in a manner soon described. At this point, however, a recapitulation of the purpose of control circuit 160 of FIG. 5 is instructive. Control circuit 160 separates indicia of the $f_t'$ signal from the $f_c$ carrier signal present at amplifier 110. Moreover, control circuit 160 generates appropriate signals at outputs 161A and 161B to cause electronically variable impedance circuit 170 to present an appropriate impedance to circulator isolation port 170C to minimize the $f_t'$ signal and thus assure that circulator 120 provides a maximum of isolation from signals which might otherwise cause undesirable intermodulation. Although control circuit 160 generates distinct control signals at outputs 161A and 161B, for convenience such control signals may collectively be referred to as a single control signal at times.

Control circuit 160 includes couplers 162 and 163 which comprise inputs 160A and 160B of control circuit 160, respectively. Coupler 162 is coupled to an input 164A of mixer circuit 164 such that the $f_c$ carrier is provided to input 164A. Mixer circuit 164 is a conventional mixer circuit well known to those skilled in the art. Coupler 163 is coupled to a second input 164B of mixer circuit 164 such that the $f_t'$ tag signal is provided to input 164B. The mixing action of mixer circuit 164 mixes the $f_c$ carrier signal and the $f_t'$ tag signal in such a manner that what is typically termed a base band signal, $f_t''$, is generated at mixer output 164C. More specifically, mixer circuit 164 generates a signal $f_t''$ at output 164C, the frequency of which equals the difference in frequency between the $f_c$ carrier signal and the $f_t'$ tag signal. Thus, in this instance wherein the $f_t'$ signal exhibits a frequency 10 kHz (for example) less than the frequency of the $f_c$ carrier signal, the $f_t''$ signal generated at mixer output 164C exhibits a frequency equal to 10 kHz plus some second order and other harmonics. It is noted that the amplitude of the $f_t''$ signal yields indicia of the amount of isolation provided by circulator of 120. That is, if the $f_t''$ signal exhibits a relatively high value, then circulator 120 is providing a relatively small amount of isolation. However, if the $f_t''$ signal is a relatively small value, then the amount of isolation provided by circulator 120 is correspondingly relatively high. Of course, this latter case is more desirable. It is thus appreciated that control circuit 160 functions to minimize the $f_t''$ signal and thus maximize circulator 120 isolation.

The output 164C of mixer circuit 164 is coupled to the input of a bandpass filter 165. Bandpass filter 165 provides a bandpass sufficiently narrow to strip away any undesired second order or other harmonics which may be undesirably superimposed upon the $f_t''$ signal provided thereto. In this example of the invention, since the $f_t''$ signal exhibits a frequency of 10 kHz, the center frequency of the bandpass filter 165 is likewise 10 kHz. A filtered $f_t''$ is thus generated at the output of bandpass filter 165.

The output of bandpass filter 165 is coupled to the input of a signal strength detector 166. Signal strength detector 166 generates a signal at its output exhibiting a DC level (or amplitude) corresponding to the amplitude of the filtered $f_t''$ signal supplied to the input of detector 166. The output signal of signal strength detector 166 is designated $f_t'''$ and is proportional (in this embodiment inversely) to the amount of isolation provided circulator 120.

Figure 8A:
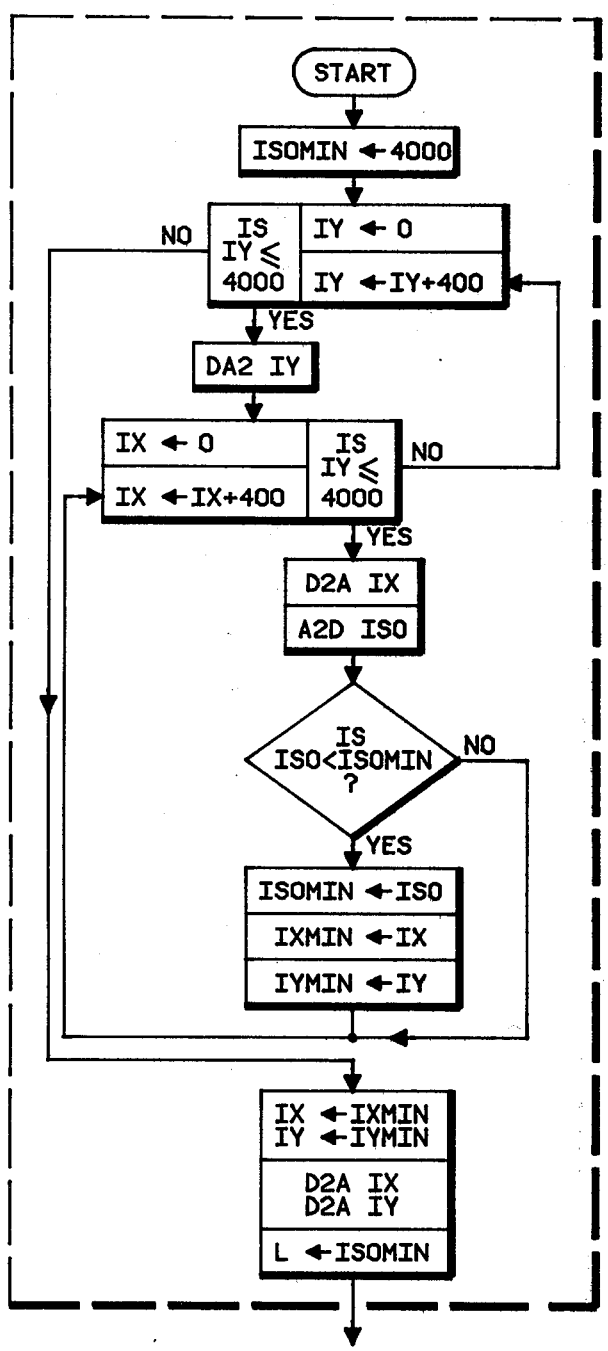

The output of signal strength detector 166 is coupled to the input of an analog to digital converter 167 such that the $f_t'''$ output signal of detector 166 is provided to the input of converter 167. Thus, the analog $f_t'''$ signal is converted to digital signals at the output of converter 167 which exhibit indicia of amplitude of the filtered $f_t''$ signal. The output of analog to digital converter 167 is coupled to the input of an electronic processing circuit 168. The output of processing circuit 168 is coupled via a digital to analog converter 169 to control circuit outputs 161A and 161B. Control circuit outputs 161A and 161B are respectively coupled to electronically variable impedance circuits inputs 170A and 170B such that the control signals generated at outputs 161A and 161B selectively determine the impedance exhibited by impedance circuit 170. Electronic processing circuit 168 preferably constitutes a microprocessor, for example, the model 6800 microprocessor manufactured by Motorola, Inc. Electronic processing circuit 168 is typically programmed to cause digital to analog converter 169 to generate respective control signals at control circuits outputs 161A and 161B such that impedance circuit 170 is instructed to exhibit an impedance which minimizes the $f_t'''$ signal provided to the input of converter 167, thus resulting in circulator 120 exhibiting an optimal maximum of isolation. (It is noted that minimization of the $f_t'''$ signal in this manner correspondingly desirably achieves minimization of the $f_t'$ and $f_t''$ signals). Processing circuit 168 typically operates in a first mode to coarsely determine appropriate control signals at outputs 161A and 161B such that a rough approximation of the particular impedance within impedance square 200 of FIG. 6 is located which results in minimizing $f_t'''$ and maximizing the isolation of circulator 120. This may be accomplished by the "Grid Search" approach employed in the section of the flow chart of FIG. 8A designated 250. After completing such a coarse determination in the first mode, electronic processing circuit 168 typically operates in a second mode designated 260 on the flow chart of FIG. 8B to zero in on the particular control signals for outputs 161A and 161B which will cause impedance circuit 170 to generate the particular impedance within impedance square 200 of FIG. 6 which will result in minimizing the $f_t'''$ signal and thus maximizing circulator 120 isolation. The approach employed in the example given in the flow chart of FIG. 8A and FIG. 8B is a "dithering" approach appreciated by those skilled in the art. For sake of completeness, a core dump of the object code which may be used in the Motorola 6800 microprocessor when employed as electronic processing circuit 168 is included in the following Table 1:

```
2000 0000 00 00 00 00 00 00 00 00 00 00 00 00 00 00 00 00
2010 0010 00 00 00 00 00 00 00 00 00 00 00 00 00 00 00 00
2020 0020 00 00 00 00 00 00 00 00 00 00 00 00 00 00 00 00
2030 0030 00 00 00 00 00 00 00 00 00 00 00 00 00 00 00 00
2040 0040 00 00 00 00 00 00 00 00 00 00 00 00 00 00 00 00
2050 0050 00 00 00 00 00 00 00 00 00 00 00 00 00 00 00 00
2060 0060 00 00 00 00 00 00 00 00 00 00 00 00 00 00 00 00
2070 0070 00 00 00 00 00 00 00 00 00 00 00 00 00 00 00 00
2080 0080 00 00 00 00 00 00 00 00 00 00 00 00 00 00 00 00
2090 0090 00 00 E0 00 00 00 00 00 00 00 00 00 00 00 00 00
20A0 00A0 00 00 00 00 00 00 00 00 00 00 00 00 00 00 00 00
20B0 00B0 00 00 00 00 00 00 00 00 00 00 00 00 00 00 00 00
20C0 00C0 00 00 00 00 00 00 00 00 00 00 00 00 00 00 00 00
20D0 00D0 00 00 00 00 00 00 00 00 00 00 00 00 00 00 00 00
20E0 00E0 00 00 00 00 00 00 00 00 00 00 00 00 00 00 00 00
20F0 00F0 00 00 00 00 00 00 00 00 00 00 00 00 00 00 00 00
2100 0100 00 00 00 00 00 00 00 00 00 00 00 00 00 00 00 00
2110 0110 00 00 00 00 00 00 00 00 00 00 00 00 00 00 00 00
2120 0120 00 00 00 00 00 00 00 00 00 00 00 00 00 00 00 00
2130 0130 00 00 00 00 00 00 00 00 00 00 00 00 00 00 00 00
2140 0140 00 00 00 00 00 00 00 00 00 00 00 00 00 00 00 00
2150 0150 00 00 00 00 00 00 00 00 00 00 00 00 00 00 00 00
2160 0160 00 00 00 00 00 00 00 00 00 00 00 00 00 00 00 00
2170 0170 00 00 00 00 00 00 00 00 00 00 00 00 00 00 00 00
2180 0180 00 00 00 00 00 00 00 00 00 00 00 00 00 00 00 00
2190 0190 00 00 00 00 00 00 00 00 00 00 00 00 00 00 00 00
21A0 01A0 00 00 8E 20 87 7E 21 D0 20 00 00 00 02 00 00
21B0 01B0 00 00 0F A0 00 01 CF A1 01 90 00 01 00 00 00 01
21C0 01C0 0F A1 01 90 00 01 00 01 00 64 00 00 00 00 00 00
21D0 01D0 BD 26 99 BD 26 78 05 00 20 08 21 B2 00 26 FE 21
21E0 01E0 B4 FF 20 0A BD 26 78 04 00 20 0A 21 BA 20 0A BD
21F0 01F0 26 56 00 21 BC 00 20 0A FE 21 BE FF 20 0C BD 26
2200 0200 78 04 00 20 0C 21 C4 20 0C BD 26 56 00 21 C6 00
2210 0210 20 0C BD 26 06 00 21 C8 BD 26 28 00 21 CA 00 20
```

```
2220 0220 0E BD 26 78 11 00 20 0E 20 08 00 26 7E 22 58 00
2230 0230 22 86 22 8F 22 AE 00 64 00 01 00 01 0F A0 23 34
2240 0240 00 01 00 64 00 00 00 01 23 3F 0F A0 23 CA 00 00
2250 0250 00 64 00 00 00 00 23 D5 BD 26 7B 31 00 26 22 65
2260 0260 FE 22 30 6E 00 BD 26 78 05 00 20 08 20 0E 00 26
2270 0270 BD 26 78 05 00 20 10 20 0C 00 26 BD 26 78 05 00
2280 0280 20 12 20 0A 00 26 BD 26 7E 21 C0 21 C2 21 FB BD
2290 0290 26 7E 21 B6 21 B8 21 E1 BD 26 78 05 00 20 0C 20
22A0 02A0 10 00 26 BD 26 78 05 00 20 0A 20 12 00 26 BD 26
22B0 02B0 06 00 22 36 BD 26 78 05 00 20 14 20 08 00 26 BD
22C0 02C0 26 78 05 00 20 16 22 38 00 26 BD 26 78 05 00 20
22D0 02D0 18 22 3A 00 26 BD 26 78 11 00 20 0C 22 3C 00 26
22E0 02E0 BD 26 7B 31 00 26 22 ED FE 22 3E 6E 00 BD 26 78
22F0 02F0 03 00 20 0C 20 16 20 0C BD 26 56 00 22 40 00 20
2300 0300 0C BD 26 06 00 22 42 BD 26 28 00 22 44 00 20 1A
2310 0310 BD 26 78 05 00 20 00 20 1A 00 26 BD 26 78 04 00
2320 0320 20 0C 20 16 20 0C BD 26 56 00 22 46 00 20 0C FE
2330 0330 22 48 6E 00 BD 26 78 05 00 20 00 20 14 00 26 BD
2340 0340 26 78 11 00 20 0A 22 4A 00 26 BD 26 7B 31 00 26
2350 0350 23 57 FE 22 4C 6E 00 BD 26 78 03 00 20 0A 20 18
2360 0360 20 0A BD 26 56 00 22 4E 00 20 0A BD 26 06 00 22
2370 0370 50 BD 26 28 00 22 52 00 20 1A BD 26 78 05 00 20
2380 0380 02 20 1A 00 26 BD 26 78 04 00 20 0A 20 18 20 0A
2390 0390 BD 26 28 00 22 54 00 20 0A 7E 23 C5 00 00 24 34
23A0 03A0 00 01 00 64 00 00 00 01 24 3F 00 00 24 9E 00 00
23B0 03B0 00 64 00 00 00 00 24 A9 00 00 00 01 00 04 00 01
23C0 03C0 00 00 00 00 00 FE 22 56 6E 00 BD 26 78 05 00 20
23D0 03D0 02 20 14 00 26 BD 26 78 10 00 20 0C 23 9C 00 26
23E0 03E0 BD 26 7B 31 00 26 23 ED FE 23 9E 6E 00 BD 26 78
23F0 03F0 04 00 20 0C 20 16 20 0C BD 26 56 00 23 A0 00 20
2400 0400 0C BD 26 06 00 23 A2 BD 26 28 00 23 A4 00 20 1A
2410 0410 BD 26 78 05 00 20 04 20 1A 00 26 BD 26 78 03 00
2420 0420 20 0C 20 16 20 0C BD 26 56 00 23 A6 00 20 0C FE
2430 0430 23 A8 6E 00 BD 26 78 05 00 20 04 20 14 00 26 BD
2440 0440 26 78 10 00 20 0A 23 AA 00 26 BD 26 7B 31 00 26
2450 0450 24 57 FE 23 AC 6E 00 BD 26 78 04 00 20 0A 20 18
2460 0460 20 0A BD 26 56 00 23 AE 00 20 0A BD 26 06 00 23
2470 0470 B0 BD 26 28 00 23 B2 00 20 1A BD 26 78 05 00 20
2480 0480 06 20 1A 00 26 BD 26 78 03 00 20 0A 20 18 20 0A
2490 0490 BD 26 56 00 23 B4 00 20 0A FE 23 B6 6E 00 BD 26
24A0 04A0 78 05 00 20 06 20 14 00 26 BD 26 78 05 00 20 1C
24B0 04B0 23 B8 00 26 FE 23 BA FF 20 1E BD 26 81 00 00 21
24C0 04C0 A8 20 20 20 1E BD 26 78 11 40 20 20 20 14 00 26
24D0 04D0 7E 24 FC 00 25 2A 00 01 25 B7 00 02 25 D0 00 03
24E0 04E0 25 E9 00 00 00 01 00 01 00 00 00 00 00 00 00 00
24F0 04F0 00 00 00 01 00 04 00 01 00 00 00 00 BD 26 7B 31
2500 0500 00 26 25 09 FE 24 D4 6E 00 BD 26 81 00 00 21 A8
2510 0510 20 22 20 1E BD 26 78 05 10 20 14 20 22 00 26 BD
2520 0520 26 78 05 00 20 1C 20 1E 00 26 BD 26 7E 23 BC 23
2530 0530 BE 24 B7 BD 26 78 11 00 20 14 20 08 00 26 BD 26
2540 0540 7B 31 00 26 25 4B FE 22 34 6E 00 BD 26 78 05 00
2550 0550 20 14 20 08 00 26 BD 26 78 0E 00 20 1C 24 D6 00
2560 0560 26 BD 26 7B 31 00 26 25 6E FE 24 D8 6E 00 BD 26
2570 0570 78 0E 00 20 1C 24 DA 00 26 BD 26 7B 31 00 26 25
2580 0580 86 FE 24 DC 6E 00 BD 26 78 0E 00 20 1C 24 DE 00
```

```
2590 0590  26 BD 26 7B 31 00 26 25 9E FE 24 E0 6E 00 BD 26
25A0 05A0  78 04 00 20 0A 20 18 20 0A BD 26 56 00 24 E2 00
25B0 05B0  20 0A FE 22 34 6E 00 BD 26 78 03 00 20 0C 20 16
25C0 05C0  20 0C BD 26 56 00 24 E4 00 20 0C FE 22 34 6E 00
25D0 05D0  BD 26 78 04 00 20 0C 20 16 20 0C BD 26 56 00 24
25E0 05E0  E6 00 20 0C FE 22 34 6E 00 BD 26 78 03 00 20 0A
25F0 05F0  20 18 20 0A BD 26 56 00 24 E8 00 20 0A FE 22 34
2600 0600  6E 00 BD 26 93 00 BD 26 87 20 88 00 00 FE 20 89
2610 0610  EE 00 FF 20 8A FE 20 8A 26 01 39 09 FF 20 8A CE
2620 0620  00 74 09 26 FD 20 EE 00 BD 26 87 20 8C 20 8E 00
2630 0630  00 FE 20 8C A6 01 84 03 48 B7 20 93 FE 20 92 A7
2640 0640  00 01 EE 00 FF 20 90 FE 20 8E B6 20 90 F6 20 91
2650 0650  A7 00 E7 01 39 00 BD 26 87 20 94 20 94 00 00 FE
2660 0660  20 94 A6 01 84 01 80 01 FE 20 96 EE 00 24 04 FF
2670 0670  E1 00 39 FF E1 02 39 00 7E 27 72 7E 26 BD 7E 27
2680 0680  0C 7E 2B 19 7E 26 9F 7E 2B AC 7E 30 52 7E 30 DD
2690 0690  7E 34 CF 7E 26 A2 7E 35 02 7E 30 3A 7E 26 9F 7E
26A0 06A0  26 A8 CE 2F 0F BD 38 EB B6 20 C9 27 06 CE 2F 41
26B0 06B0  BD 38 EF FE 21 A0 27 02 AD 00 7E 38 F1 30 EE 00
26C0 06C0  FF 20 A9 A6 00 EE 01 85 40 27 02 EE 00 A6 00 2B
26D0 06D0  2D 26 04 A6 01 27 1C FE 20 A9 EE 03 27 0A FE 20
26E0 06E0  A9 08 08 08 08 08 20 07 FE 20 A9 EE 09 EE 00 31
26F0 06F0  31 6E 00 FE 20 A9 6D 03 26 E7 EC 07 20 EF FE 20
2700 0700  A9 EE 03 26 EA FE 20 A9 EE 05 20 E1 30 EE 00 FF
2710 0710  20 A9 5F 86 06 BB 20 AA F9 20 A9 30 E7 00 A7 01
2720 0720  FE 20 A9 A6 03 44 EE 02 24 03 C9 EE 00 A6 00 E6
2730 0730  01 FE 20 A9 EE 04 FF 20 98 EE 01 EB 01 A9 00 B7
2740 0740  20 9A F7 20 9B FE 20 A9 A6 01 44 EE 00 24 03 09
2750 0750  EE 00 A6 00 B1 20 9A 2E 0A 2D 16 A6 01 B1 20 9B
2760 0760  24 01 39 F6 20 98 B6 20 99 30 E7 00 A7 01 FE 20
2770 0770  9A 39 DF 20 AB 30 EE 00 FF 20 A9 5F A6 00 81 06
2780 0780  2F 10 80 04 81 05 26 01 4C 81 09 2F 05 80 09 16
2790 0790  86 04 B7 20 AE F7 20 AD A6 01 EE 02 85 40 27 02
27A0 07A0  EE 00 FF 20 AF FE 20 A9 EE 04 85 10 27 02 EE 00
27B0 07B0  FF 20 B1 FE 20 A9 EE 06 85 04 27 02 EE 00 FF 20
27C0 07C0  B3 84 A8 B7 20 CA 27 60 FE 20 A9 A6 00 81 05 26
27D0 07D0  16 FE 20 6F FF 20 B3 FE 20 B1 FF 20 AF B6 20 CA
27E0 07E0  48 49 84 81 B7 20 CA FE 20 AF E6 00 A6 01 EE 02
27F0 07F0  FF 20 A2 F7 20 A0 C6 80 CE 20 9F 8D 3D B6 20 AE
2800 0800  27 1E 81 08 2C 04 81 04 2E 16 FE 20 B1 E6 00 A6
2810 0810  01 EE 02 FF 20 A7 F7 20 A5 C6 20 CE 20 A4 8D 1A
2820 0820  B6 20 AE CE 29 E2 20 06 B6 20 AE CE 28 7B 4D 27
2830 0830  05 08 08 4A 26 FB EE 00 6E 00 A7 02 F4 20 CA 27
2840 0840  01 39 E6 01 7F 20 9E 5D 2A 05 7C 20 9E 8D 40 E7
2850 0850  00 A7 01 6F 02 6F 03 6F 04 5F A6 00 AA 01 27 12
2860 0860  86 04 66 00 66 01 66 02 66 03 66 04 4A 26 F3 5C
2870 0870  20 E8 B6 20 9E 58 46 56 E7 01 39 28 D8 29 28 29
2880 0880  74 28 DE 28 F4 28 D2 27 C8 28 9F 28 AC 28 B2 43
2890 0890  53 89 00 C9 00 39 FE 20 AF A6 00 FE 20 B1 39 8D
28A0 08A0  F5 43 5F 48 86 01 24 02 8D E5 20 15 8D E8 AA 00
28B0 08B0  20 F0 8D E2 A4 00 20 EA FE 20 AF E6 00 A6 01 8D
28C0 08C0  CE FE 20 B3 E7 00 A7 01 BE 20 AB FE 20 A9 31 31
28D0 08D0  6E 08 FE 20 B1 E6 00 A6 01 FE 20 AF 20 E6 FE 20
28E0 08E0  AF A6 01 E6 00 FE 20 B1 A8 01 E9 00 28 D3 CE 35
```

```
28F0 08F0  31 7E 38 F4 FE 20 AF E6 00 A6 01 FE 20 BD A0 01
2900 0900  E2 00 2D 0C 28 05 7D 20 AD 27 E3 7F 20 9E 20 0D
2910 0910  28 05 7D 20 AD 27 D7 7F 20 9E 7A 20 9E 7D 20 AD
2920 0920  27 9F BD 29 B2 7E 28 A2 8D 24 30 48 59 68 01 69
2930 0930  00 24 06 AD 04 E7 03 25 B5 6A 04 26 EE 5D 2D AE
2940 0940  36 A6 02 A8 05 32 2A 03 BD 28 8F 7E 28 C1 86 10
2950 0950  36 FE 20 B1 A6 01 E6 00 37 2A 03 BD 28 8F 36 37
2960 0960  FE 20 AF A6 01 E6 00 37 2A 03 BD 28 8F 36 37 30
2970 0970  EE 07 6E 00 8D D8 30 86 01 6D 03 2B 0B 4C 68 04
2980 0980  69 03 2B 04 81 11 26 F5 A7 06 A6 01 E6 00 6F 00
2990 0990  6F 01 A0 04 E2 03 24 07 AD 04 E9 03 0C 20 01 0D
29A0 09A0  69 01 69 00 64 03 66 04 6A 06 26 E6 E6 00 A6 01
29B0 09B0  20 8B 4D 27 02 CA 01 B6 20 AD CE 29 D5 08 4A 26
29C0 09C0  FC 5D 07 84 04 7D 20 9E 2A 02 8A 08 A1 00 27 05
29D0 09D0  A1 06 27 01 43 39 04 00 04 04 08 00 04 08 08 00
29E0 09E0  08 00 2A 12 2A 1C 2A 1F 24 2C 2A 30 2A AB 2A B2
29F0 09F0  29 F6 2A 02 2A 0A B6 20 A0 43 DD 2B 0C 4D 2B 12
2A00 0A00  20 50 B6 20 A0 BA 20 A5 20 F0 B6 20 A0 B4 20 A5
2A10 0A10  20 E8 B6 20 A0 88 80 B7 20 A0 20 36 5F 20 13 C6
2A20 0A20  01 BD 2B F4 20 A5 20 A0 20 A0 20 26 C6 02 20 02
2A30 0A30  C6 03 DD 2B F4 20 A0 20 A5 20 A0 B6 20 AD 27 12
2A40 0A40  F6 20 A0 F7 20 9E B6 20 A1 27 02 CA 01 DD 29 B2
2A50 0A50  20 A8 B6 20 CA 84 03 27 16 FE 20 B3 F6 20 A2 B6
2A60 0A60  20 A3 E7 02 A7 03 F6 20 A0 B6 20 A1 7E 28 C1 CE
2A70 0A70  20 9F A6 01 5F 48 59 47 F7 20 9E 6F 00 6F 01 16
2A80 0A80  2F 16 86 04 68 04 69 03 69 02 69 01 69 00 2A 06
2A90 0A90  CC 35 31 7E 38 F4 4A 26 EB 5A 26 E6 E6 00 A6 01
2AA0 0AA0  7D 20 9E 27 03 BD 28 8F 7E 28 C1 B6 20 CA 84 01
2AB0 0AB0  20 A5 FE 20 A0 FF 20 A5 FE 20 A2 FF 20 A7 FE 20
2AC0 0AC0  B1 EE 00 26 04 8D 45 20 89 FF 20 B1 B6 20 B1 2B
2AD0 0AD0  15 FE 20 B1 09 FF 20 B1 27 ED 5F BD 2B F4 20 A0
2AE0 0AE0  20 A5 20 A0 20 EB FE 20 B1 08 FF 20 B1 27 0C 5F
2AF0 0AF0  BD 2B F4 20 A0 20 A5 20 A0 20 EB FE 20 A0 FF 20
2B00 0B00  A5 FE 20 A2 FF 20 A7 8D 03 7E 24 1F CE 01 10 FF
2B10 0B10  20 A0 7F 20 A2 7F 20 A3 39 30 EE 00 FF 20 98 86
2B20 0B20  03 B7 20 7A EE 04 FF 20 9C FE 20 98 A6 00 E6 01
2B30 0B30  EE 02 FF 20 B9 ED 01 A9 00 36 37 FF 20 BB EE 04
2B40 0B40  27 45 FF 20 C1 FE 20 98 A6 07 44 EE 06 27 22 24
2B50 0B50  03 09 EE 00 EE 00 09 27 18 FF 20 BD BD 27 72 01
2B60 0B60  00 20 BD 20 C1 20 BF 33 32 FD 20 C0 B9 20 BF 20
2B70 0B70  02 33 32 FE 20 98 08 08 FF 20 98 7A 20 9A 27 09
2B80 0B80  FE 20 BB 08 08 20 B2 33 32 FE 20 9C A7 00 E7 01
2B90 0B90  FE 20 B9 E0 01 A2 00 2D 0D E0 03 A2 02 24 07 FE
2BA0 0BA0  20 98 31 31 6E 06 CE 35 30 7E 38 F4 30 EE 00 FF
2BB0 0BB0  20 C5 30 EE 02 FF 20 C7 E6 00 A6 01 C4 40 27 05
2BC0 0BC0  EE 01 A6 00 09 E6 02 FE 20 C5 EE 00 27 14 A7 00
2BD0 0BD0  E7 01 FE 20 C5 08 08 FF 20 C5 FE 20 C7 08 08 08
2BE0 0BE0  20 D3 31 31 B6 20 C7 F6 20 C8 30 A7 00 E7 01 FE
2BF0 0BF0  20 C5 6E 02 30 EE 00 EE 00 4F 36 A6 03 36 A6 02
2C00 0C00  36 A6 01 36 A6 00 36 30 EE 05 EE 02 4F 36 A6 03
2C10 0C10  36 A6 02 36 A6 01 36 A6 00 36 4F 36 36 36 36 36
2C20 0C20  36 36 30 C1 01 25 5F 26 5A 7E 2E 75 6D 06 2A 29
2C30 0C30  6C 05 26 25 6C 04 26 21 6C 03 26 1D 0D 86 04 66
2C40 0C40  03 66 04 66 05 66 06 0C 4A 26 F4 68 02 66 00 6C
2C50 0C50  02 6C 02 29 2C 69 00 66 02 31 33 EE 11 EE 04 32
```

```
2C60 0C60 A7 00 32 A7 01 32 A7 02 32 A7 03 86 0B 31 4A 26
2C70 0C70 FC 30 EE 00 31 31 5D 27 06 CE 35 32 7E 38 F4 6E
2C80 0C80 06 20 6E 7E 2D 0A 86 0C BD 2D F0 86 07 BD 2D F0
2C90 0C90 86 19 A7 00 5F 66 0D 66 0E 66 0F 6A 00 27 19 24
2CA0 0CA0 CE ED 0A A6 04 A9 09 A7 04 A6 03 A9 08 A7 03 66
2CB0 0CB0 03 66 04 56 66 06 20 DD E7 05 A6 0C 16 E8 07 C4
2CC0 0CC0 80 6F 00 48 68 07 AB 07 29 13 0C 46 1B A7 02 86
2CD0 0CD0 02 BD 2D F0 6D 00 27 02 6C 02 7E 2C 2C 2A 1C 36
2CE0 0CE0 A6 03 85 F0 32 26 0A 81 80 26 06 86 3F A7 00 20
2CF0 0CF0 DB C4 80 CA 3F 86 FF 6C 01 20 02 5F 4F A7 03 A7
2D00 0D00 04 A7 05 6F 06 E7 02 7E 2C 2C 37 86 0C BD 2D F0
2D10 0D10 86 07 BD 2D F0 86 08 A7 00 A6 0C 48 E6 07 58 6A
2D20 0D20 00 2D 31 11 27 32 2E 0C 8D 16 8D 14 8D 12 8D 10
2D30 0D30 8D 02 20 ED 8D 14 8D 12 8D 10 8D 0E CB 02 20 DF
2D40 0D40 0C 66 0D 66 0E 66 0F 66 10 39 0C 66 08 66 09 66
2D50 0D50 0A 66 0B 39 11 2E 01 17 A7 02 8D E4 8D EC A6 0C
2D60 0D60 2A 05 86 CC BD 2E 39 A6 07 24 05 86 07 BD 2E 39
2D70 0D70 32 81 02 26 5D A6 10 AB 0B A7 06 A6 0F A9 0A A7
2D80 0D80 05 A6 0E A9 09 A7 04 A6 0D A9 08 28 1F A7 03 86
2D90 0D90 04 66 03 20 02 67 03 66 04 66 05 66 06 4A 26 F5
2DA0 0DA0 6C 02 6C 02 28 08 69 03 56 7F 2C F1 A7 03 6D 03
2DB0 0DB0 0C 2A 08 86 02 BD 2E 39 0D 29 ED 66 02 69 06 69
2DC0 0DC0 05 69 04 69 03 A6 03 85 F0 26 04 86 02 8D 21 7E
2DD0 0DD0 2C 2C A6 10 A0 0D A7 06 A6 0F A2 0A A7 05 A6 0E
2DE0 0DE0 A2 09 A7 04 A6 0D A2 08 25 03 0D 20 9E 0C 20 9B
2DF0 0DF0 36 5F 08 4A 26 FC A6 01 AA 02 AA 03 AA 04 27 33
2E00 0E00 68 00 59 A6 01 85 F0 26 0E 6A 00 29 06 6A 00 8D
2E10 0E10 14 20 F0 6C 00 CA 04 56 66 00 32 09 4A 26 FC 07
2E20 0E20 84 10 1B 06 39 86 04 68 04 69 03 69 02 69 01 4A
2E30 0E30 26 F5 39 C6 04 6F 00 20 E1 16 08 4A 26 FC 07 63
2E40 0E40 01 63 02 63 03 63 04 6C 04 26 0D 6C 03 26 09 6C
2E50 0E50 02 26 05 6C 01 29 0A 07 09 5A 26 FC 06 39 7E 2C
2E60 0E60 F1 86 04 0C 66 01 66 02 66 03 66 04 4A 26 F4 6C
2E70 0E70 00 6C 00 20 E2 86 07 BD 2D F0 86 0C BD 2D F0 29
2E80 0E80 DD 27 DB 86 05 64 08 66 09 66 0A 66 0B 4A 26 F5
2E90 0E90 64 0D 66 0E 66 0F 66 10 E6 0D 86 1D 36 58 69 0A
2EA0 0EA0 69 09 69 08 68 06 69 05 69 04 69 03 E0 10 A6 0A
2EB0 0EB0 A2 0F A7 0A A6 09 A2 0E A7 09 A6 08 A2 0D A7 08
2EC0 0EC0 24 16 EB 10 A6 0A A9 0F A7 0A A6 09 A9 0E A7 09
2ED0 0ED0 A6 08 A9 0D A7 08 20 02 6C 06 32 4A 26 DE 86 03
2EE0 0EE0 68 06 69 05 69 04 69 03 4A 26 F5 A6 07 16 E8 0C
2EF0 0EF0 C4 80 6F 00 48 68 0C A0 0C 28 05 2A 08 7E 2C F1
2F00 0F00 8B 02 7E 2C C8 8B 02 28 03 0A 20 F6 7E 2C FB 20
2F10 0F10 53 54 4F 50 0D 0A 04 2D 3F 20 00 00 04 0C 0D 0A
2F20 0F20 04 2D 5C 04 30 2A 24 24 20 45 58 45 43 55 54 49
2F30 0F30 4F 4E 20 54 49 4D 45 20 45 52 52 4F 52 20 23 04
2F40 0F40 30 04 BD 32 C1 CE 2F 17 BD 38 EB CE 20 F9 FF 20
2F50 0F50 CB FE 20 CB DD F0 15 81 7F 27 25 81 18 27 19 81
2F60 0F60 1D 27 2E A7 01 81 04 27 31 08 8C 21 7D 27 04 81
2F70 0F70 0D 26 DB 86 04 A7 00 39 CE 2F 41 BD 38 EB 20 C2
2F80 0F80 09 8C 20 F8 27 F2 FF 20 CB CE 2F 21 BD 38 EB 20
2F90 0F90 C0 CE 2F 40 BD 38 EB 7E 26 93 FF 20 CB CE 20 F9
2FA0 0FA0 BD 38 EB 20 AC A6 00 08 81 20 27 12 81 30 27 0B
2FB0 0FB0 81 31 27 10 81 2D 27 09 09 20 03 BD F0 21 BD F0
2FC0 0FC0 21 7E F0 27 BD F0 21 FF 20 CB CE 2F 1D 8D F2 FE
```

```
2FD0 0FD0 20 CB 20 ED A6 00 08 FF 20 CB 81 20 27 14 81 30
2FE0 0FE0 27 0E 81 31 27 14 81 2B 27 0A 09 FF 20 CB 20 02
2FF0 0FF0 8D 11 8D 0F FE 20 CB 7E EB F2 8D 07 CE 2F 1D 8D
3000 1000 F6 20 F1 CE 2F 41 7E EB E4 7E 30 12 7E 30 12 7E
3010 1010 30 12 CE 34 34 7E 38 F4 FF 20 B6 86 2B B7 20 B5
3020 1020 86 04 B7 20 B8 CE 2F 24 BD 38 EB CE 20 B5 BD 39
3030 1030 EB CE 2F 40 BD 38 EB 7E 26 9F CE 00 00 FF 21 A0
3040 1040 CE 20 B9 4F A7 00 08 8C 20 CB 26 F8 86 7E B7 21
3050 1050 9C 39 30 EE 00 FF 20 CF 31 31 FE 38 EC FF 21 9D
3060 1060 FE 20 CF A6 00 B7 21 7F 7F 20 F6 81 02 2C 02 20
3070 1070 46 A6 02 EE 01 44 24 03 09 EE 00 A6 01 81 64 27
3080 1080 18 81 65 27 0D 81 66 26 15 FE 38 EF FF 21 9D B7
3090 1090 20 C9 86 01 B7 21 7F 20 16 7F 21 7F 20 11 B7 20
30A0 10A0 F6 7F 21 98 B6 21 7F 80 02 B7 21 7F FF 20 CB FE
30B0 10B0 20 CF 03 08 FF 20 CF EE 01 EE 00 08 08 09 FF 21
30C0 10C0 80 FF 21 82 CE 20 F9 FF 20 F7 CE 21 81 FF 21 96
30D0 10D0 B6 21 7F 26 03 BD 32 A6 FE 20 CF 6E 03 30 EE 00
30E0 10E0 FF 20 CF 31 31 A6 00 B7 20 D3 EE 01 FF 20 D1 85
30F0 10F0 40 27 05 EE 00 FF 20 D1 84 01 27 3A FE 20 CF EE
3100 1100 01 EE 02 FF 21 99 B6 21 9A F6 21 99 BB 20 D2 F9
3110 1110 20 D1 F7 21 99 B7 21 9A FE 21 99 BC 20 D1 27 18
3120 1120 8D 1B FE 20 D1 08 08 FF 20 D1 B6 20 D3 2A E9 08
3130 1130 08 FF 20 D1 20 E2 8D 05 FE 20 CF 6E 03 FE 21 80
3140 1140 A6 00 16 4C B7 20 CD A6 01 B7 20 D8 B7 20 CE C4
3150 1150 0E C1 06 26 12 44 44 44 44 B7 20 DF B6 20 CE 84
3160 1160 0F BB 20 DF B7 20 D8 B6 21 7F 26 0E F6 20 CD 58
3170 1170 CE 31 7D BD 38 D6 EE 00 6E 00 7E 32 DD 31 93 32
3180 1180 D7 33 5D 33 52 31 AB 31 AB 31 AB 31 AB 34 6C 34
3190 1190 87 34 B2 FE 21 82 BC 21 80 27 08 FF 21 80 BD 32
31A0 11A0 A6 20 9A B6 20 D3 2A 6A 7E 35 24 FE 20 F7 F6 20
31B0 11B0 D8 BD 38 D0 A6 01 B7 20 D9 86 04 A7 01 B6 20 CD
31C0 11C0 81 05 26 04 8D 4C 20 0B 81 06 26 04 8D 10 20 03
31D0 11D0 BD 35 24 B6 20 D9 FE 20 F7 A7 00 7E 34 4E BD 32
31E0 11E0 8D 86 20 B7 20 D4 B7 20 D5 B6 20 D6 81 04 27 14
31F0 11F0 B7 20 D4 B6 20 CE 81 01 27 0A BD 32 8D 81 04 27
3200 1200 03 B7 20 D5 B6 20 D8 81 02 2F 74 7A 20 D8 8D 7D
3210 1210 20 F2 CE 00 00 FF 20 D4 7F 20 D7 8D 70 B6 20 D6
3220 1220 81 20 26 02 86 30 81 2D 26 05 7C 20 D7 20 EC 81
3230 1230 30 2D 30 81 39 2E 2C F6 20 D4 B6 20 D5 48 59 48
3240 1240 59 DB 20 D5 F9 20 D4 48 59 F7 20 DF B7 20 E0 5F
3250 1250 B6 20 D6 84 0F BB 20 E0 B7 20 D5 F9 20 DF F7 20
3260 1260 D4 20 B8 81 2C 27 04 81 04 26 B0 B6 20 D7 27 0F
3270 1270 B6 20 D5 F6 20 D4 BD 29 8F F7 20 D4 B7 20 D5 F6
3280 1280 20 D4 B6 20 D5 FE 20 D1 E7 00 A7 01 39 FE 20 F7
3290 1290 A6 00 B7 20 D6 81 0A 26 04 86 04 20 F5 81 04 27
32A0 12A0 04 08 FF 20 F7 39 CE 20 FA FF 20 F7 B6 20 F6 27
32B0 12B0 23 81 63 27 0D B6 21 98 27 15 86 04 A7 01 A7 00
32C0 12C0 39 86 20 C6 86 CE 20 F9 A7 00 09 5A 26 FA 39 8D
32D0 12D0 F0 7E 30 09 7E 38 E8 8D CD 20 77 21 7E 5F B6 20
32E0 12E0 D8 2C 01 53 BB 20 F8 F9 20 F7 F1 32 DB 25 0A 26
32F0 12F0 05 D1 32 DC 23 03 BD 34 DD B6 20 D3 4C 26 24 F6
3300 1300 20 CD 58 CE 33 0B BD 38 D6 EE 00 6E 00 34 DD 33
3310 1310 4F 33 5D 34 DD 34 DD 34 DD 34 DD 34 DD 34 6C 34
3320 1320 87 34 B2 F6 20 CD 58 CE 33 2F BD 38 D6 EE 00 6E
3330 1330 00 33 47 33 4F 33 5D 33 6E 33 70 34 57 34 67 34
```

```
3340 1340 67 34 6C 34 87 34 B2 FE 21 82 09 09 FF 21 80 BD
3350 1350 34 DD FE 21 80 08 08 FF 21 80 7E 31 3D F6 20 CE
3360 1360 FE 20 F7 86 20 A7 00 08 5A 26 FA FF 20 F7 20 E2
3370 1370 CE 20 E6 FF 20 E1 B6 20 CE 26 03 7E 34 4E B7 20
3380 1380 E4 7F 20 E5 FE 20 D1 A6 00 2A 0E FE 20 E1 86 2D
3390 1390 A7 00 08 FF 20 E1 7A 20 E4 FE 20 D1 A6 01 E6 00
33A0 13A0 2A 03 BD 28 8F CE 38 C6 7F 20 E3 A0 01 E2 00 25
33B0 13B0 05 7C 20 E3 20 F5 AB 01 E9 00 FF 20 DF 36 7D 20
33C0 13C0 E5 26 05 B6 20 E3 27 14 B6 20 E3 8A 30 FE 20 E1
33D0 13D0 A7 00 08 FF 20 E1 7C 20 E5 7A 20 E4 FE 20 DF 32
33E0 13E0 08 08 8C 38 D0 26 C1 7D 20 E5 26 0E FE 20 E1 86
33F0 13F0 30 A7 00 08 FF 20 E1 7A 20 E4 B6 20 E4 24 09 40
3400 1400 BD 20 CE B7 20 CE 20 13 27 11 C6 20 FE 20 F7 E7
3410 1410 00 08 7A 20 CE 4A 26 F7 FF 20 F7 F6 20 CE CE 20
3420 1420 E6 FF 20 E1 FE 20 E1 A6 00 08 FF 20 E1 FE 20 F7
3430 1430 A7 00 08 FF 20 F7 5A 26 ED 20 13 5F D6 20 CE 2C
3440 1440 01 53 DD 20 F8 B7 20 F8 F9 20 F7 F7 20 F7 FE 21
3450 1450 80 08 08 FF 21 80 39 FE 20 D1 E6 00 A6 01 FE 20
3460 1460 F7 E7 00 A7 01 20 D4 BD 37 0A 20 E2 F6 20 CE FE
3470 1470 21 80 A6 02 08 FF 21 80 FE 20 F7 A7 00 08 FF 20
3480 1480 F7 5A 26 ED 7E 33 52 B6 21 9B FE 21 96 08 08 08
3490 1490 FF 21 96 8C 21 96 26 06 CE 34 30 7E 38 F4 A7 00
34A0 14A0 B6 20 CE B7 21 9D F6 21 80 B6 21 81 E7 01 A7 02
34B0 14B0 20 1A FE 21 96 7A 21 9B 27 07 EE 01 FF 21 80 20
34C0 14C0 0D A6 00 B7 21 9B 09 09 09 FF 21 96 7E 33 52 B6
34D0 14D0 21 7F 26 01 39 86 FF B7 20 D3 7E 31 3D FE 20 F7
34E0 14E0 86 04 A7 00 FF 20 CB CE 20 F9 B6 20 F6 27 09 81
34F0 14F0 63 27 08 BD 30 0C 20 03 BD 21 9C CE 20 F9 FF 20
3500 1500 F7 39 30 EE 00 FF 20 CF 31 31 A6 01 44 EE 00 24
3510 1510 03 09 EE 00 FF 20 CB A6 01 B7 20 F6 BD 30 0F FE
3520 1520 20 CF 6E 02 CE 00 00 FF 20 CB FE 20 F7 A6 00 81
3530 1530 2E 27 1F 09 81 04 27 04 81 2C 26 F1 B6 20 CE 27
3540 1540 11 44 44 44 44 5F BF 20 F8 F9 20 F7 F7 20 CB B7
3550 1550 20 CC CE 00 00 FF 20 EA FF 20 EC 7F 20 DC 7F 20
3560 1560 E8 7F 20 E9 FE 20 CB BC 20 F7 27 11 BD 36 97 25
3570 1570 08 BD 36 75 BD 36 86 20 EB C1 2E 26 10 BD 36 97
3580 1580 25 0B BD 36 75 BD 36 86 7A 20 E8 20 F0 B6 20 DC
3590 1590 B7 20 D7 7F 20 DC C1 45 26 1E 4F BD 36 97 25 0C
35A0 15A0 B7 20 F2 48 48 BB 20 F2 48 1B 20 EF 7D 20 DC 27
35B0 15B0 01 40 BD 20 E8 B7 20 E8 6F 04 6F 05 6F 06 6F 07
35C0 15C0 A6 00 AA 01 AA 02 AA 03 27 35 86 04 64 00 66 01
35D0 15D0 66 02 66 03 66 04 66 05 66 06 66 07 4A 26 ED 7C
35E0 15E0 20 E9 A6 00 AA 01 AA 02 AA 03 26 DE F6 20 E8 2F
35F0 15F0 0E CE 20 ED BD 36 75 7A 20 E8 CE 20 EA 20 E3 27
3600 1600 4D CE 20 EE 8D 07 7C 20 E8 26 F9 20 41 BD 36 D8
3610 1610 8A 80 B7 20 F5 6F 00 6F 01 6F 02 6F 03 BD 36 CB
3620 1620 C6 08 BD 36 CB BD 36 CB BD 36 CB BD 36 ED BD 36
3630 1630 CB BD 36 ED 5A 26 EB A6 00 84 F0 26 10 7A 20 E9
3640 1640 C6 04 68 03 69 02 69 01 69 00 5A 26 F5 39 B6 20
3650 1650 E9 84 7F F6 20 D7 27 02 8A 80 B7 20 ED FE 20 D1
3660 1660 B6 20 ED A7 00 B6 20 EE A7 01 B6 20 EF A7 02 B6
3670 1670 20 F0 A7 03 39 8D 61 8D 04 8D 02 8D 70 68 03 69
3680 1680 02 69 01 69 00 39 EB 03 E7 03 24 0A 6C 02 26 06
3690 1690 6C 01 26 02 6C 00 39 FE 20 F7 E6 00 08 C1 20 26
```

```
36A0 16A0 02 C6 30 C1 2B 27 F3 C1 2D 26 05 7C 20 DC 20 EA
36B0 16B0 FF 20 F7 C1 04 26 04 09 FF 20 F7 CE 20 EA C1 30
36C0 16C0 2D 07 C1 39 2E 03 C0 30 39 0D 39 74 20 F2 76 20
36D0 16D0 F3 76 20 F4 76 20 F5 39 A6 00 B7 20 F2 A6 01 B7
36E0 16E0 20 F3 A6 02 B7 20 F4 A6 03 B7 20 F5 39 B6 20 F5
36F0 16F0 AB 03 A7 03 B6 20 F4 A9 02 A7 02 B6 20 F3 A9 01
3700 1700 A7 01 B6 20 F2 A9 00 A7 00 39 7F 20 DF B6 20 CE
3710 1710 84 0F B7 20 DB B6 20 CE 44 44 44 44 BB 20 DB B7
3720 1720 20 DA 7F 20 DC B6 20 CD 81 07 27 03 7C 20 DC FE
3730 1730 20 D1 A6 00 5F 48 59 47 B7 20 E9 F7 20 D7 A6 01
3740 1740 EE 02 85 F0 26 15 B7 20 EE D7 20 EF B7 20 F0 D7
3750 1750 20 F1 4A B7 20 E8 B7 20 E9 20 4E D7 20 EE FF 20
3760 1760 EF 7F 20 F1 7F 20 E8 F6 20 E9 2E 20 BD 39 A1 A6
3770 1770 00 27 14 86 04 64 00 66 01 66 02 66 03 66 04 4A
3780 1780 26 F3 7C 20 E9 20 E8 7A 20 E9 20 DB C1 01 2D 19
3790 1790 2E 09 B6 20 EE 84 F0 81 90 23 0E CE 20 EE BD 36
37A0 17A0 0D 7C 20 E8 F6 20 E9 20 E3 C6 04 B6 20 DC 26 01
37B0 17B0 5F B6 20 DB 4C B7 20 DD B6 20 DA 10 B7 20 DA B0
37C0 17C0 20 DB 80 02 5D 26 07 F6 20 E8 5C 2F 01 10 B7 20
37D0 17D0 DE 2F 13 FE 20 F7 C6 20 E7 00 08 7A 20 DA 4A 26
37E0 17E0 F7 FF 20 F7 20 25 27 23 70 20 DE B6 20 CE 16 C4
37F0 17F0 0F 44 44 44 44 1D BB 20 DE 7D 20 D7 26 08 B1 20
3800 1800 DA 27 03 7C 20 DF B7 20 DA 20 9E F6 20 E9 27 10
3810 1810 CE 20 ED 6F 00 86 04 BD 36 7D 4A 26 FA 5A 26 F5
3820 1820 7D 20 DF 26 04 86 20 20 01 4F 7D 20 D7 27 02 86
3830 1830 2D F6 20 DA 5A F1 20 DD 26 0D 7D 20 DE 2F 08 FE
3840 1840 20 F7 09 A7 00 86 30 8D 61 27 17 7C 20 E8 2C 05
3850 1850 7D 20 DC 27 F0 B6 20 ED 8A 30 8D 4E 2F 04 8D 41
3860 1860 20 F3 B6 20 DC 27 30 86 45 A7 00 C6 2B B6 20 E8
3870 1870 2A 03 40 C6 2D E7 01 81 63 23 0A C1 2B 27 1C 86
3880 1880 39 A7 02 20 0C 5F 5C 80 0A 2C FB CB 2F E7 02 8D
3890 1890 3A A7 03 08 08 08 09 FF 20 F7 39 CE 35 32 7E 38
38A0 18A0 F4 7F 20 ED CE 20 ED 7E 36 75 FE 20 F7 A7 00 B6
38B0 18B0 20 DA 08 4A B1 20 DD 26 06 C6 2F E7 00 08 4A FF
38C0 18C0 20 F7 B7 20 DA 39 27 10 03 E8 00 64 00 0A 00 01
38D0 18D0 5D 26 02 09 39 5A FF 20 E5 FB 20 E6 F7 20 E6 24
38E0 18E0 03 7C 20 E5 FE 20 E5 39 7E 2F 42 7E 2F A5 7E 2F
38F0 18F0 D4 3F 1A 01 7E 30 18 00 .. .. .. .. .. .. .. ..
```

Electronic processing circuit 168 includes a random access memory (RAM-not shown) into which the object code of FIG. 9 is conveniently read in order to cause electronic processing circuit 168 to perform in the above described manner.

As already discussed in general, the adaptive intermodulation minimization apparatus of the present invention shown in FIG. 5 includes a reflection circuit 140 coupled to connecting line 130 to generate a relatively low level signal $f_t$ sufficiently displaced in frequency from the carrier signal $f_c$ so as to be distinguishable therefrom and thus comprise a tag signal. One circuit which may be employed as reflection circuit 140 is shown in detail in FIG. 5. Reflection circuit 140 operates in a manner whereby the impedance exhibited thereby and presented to coupling point 321 is cycled through three impedance states each with a reflection coefficient $\pi$ of approximately equal to one but with angles 120° apart. Reflection circuit 140 cycles among the three aforementioned states at a rate or frequency equal to $f_s$. Thus, a modulation sideband exhibiting a frequency of $f_c + f_s/3$ or $f_c - f_s/3$ is generated depending upon various operating parameters which will be subsequently discussed in detail.

Reflection circuit 140 includes a coupler 300 having one port thereof terminated in a load resistance 310 equal to the characteristic impedance of coupler 300. Since it is desirable that the $f_t$ tag signal exhibits a relatively low level with respect to the amplitude of the $f_c$ carrier signal, for example 60 dB below the $f_c$ signal, coupler 300 is selected to exhibit −30 dB of coupling in the embodiment of this example. (Note, −30 dB + −30 dB = −60 dB). Coupler 300 includes a remaining port electrically connected to one end of a transmission line having a length of 2 λ/6 or λ/3. λ is the wavelength associated with the frequency $f_c$. Transmission line 320 includes three connection points—321, 322, and 323. Coupling points 321 and 323 are situated at the opposed ends of transmission line 320 and thus are situated a distance λ/3 apart. Coupling point 322 is situated at the midpoint of transmission line 320, that is, half way between coupling points 321 and 323. Therefore, the distance between connection point 321 and 322 is λ/6 and the distance between connection point 322 and connection point 323 is likewise λ/6. Connection point 323 is coupled to ground as seen in FIG. 5.

Reflection circuit 140 includes a first variable impedance network 330 having an input 330A and an output 330B. Impedance network 330 is appropriately configured such that when a logical one or high is provided to input 330A, the impedance exhibited at output 330B is essentially equal to 0 ohms or a short circuit to ground. More specifically, impedance network 330 includes a PIN diode 332 which exhibits a resistance varying with the magnitude of the voltage applied across such diode. The anode of diode 332 is coupled via an inductor 334 to input 330A and one terminal of a capacitor 336. The remaining terminal of capacitor 336 is coupled by an inductor 338 to ground at which ground point the cathode of diode 332 is also connected as shown in FIG. 5. Capacitor 336 and inductor 338 cooperate to cancel out or minimize the effects of any parasitic capacitance and inductance associated with diode 332. The node formed between capacitor 336 and inductor 338 is connected to output 330B such that diode 332 which exhibits variable resistance is coupled to coupling point 321 of transmission line 320.

Reflection circuit 140 includes a second variable resistance network 340 having an input 340A and an output 340B. Variable resistance network 340 is substantially similar to variable resistance network 330 discussed above. When a logical one or voltage high is provided to input 340A, variable resistance network 340 exhibits a resistance essentially equal to 0 ohms or a short circuit to ground at output 340B. However, if a logical zero is supplied to input 340A, the impedance exhibited at otuput 340B is substantially equal to ∞ ohms. Resistance network 340 includes a PIN diode 342, an inductor 344, a capacitor 346 and an inductor 348 connected together in substantially the same manner as respective elements 332, 334, 336, and 338 of resistance network 330 with the following modification. The juncture or node formed between capacitor 346 and inductor 348 constitutes the output 340B of variable resistance network 340 and is coupled to coupling point 322 of transmission line 320.

Reflection circuit 140 includes a counter-decoder circuit 350 which includes two outputs designated A and B as shown in FIG. 5. Counter-decoder 350 generates a logical zero or a logical one at outputs A and B in accordance with the state table of FIG. 9 which will be discussed subsequently in more detail. Counter-decoder 350 changes the selected combination of logical one and logical zero applied to outputs A and B at a rate or frequency determined by the frequency $f_s$ of a clock oscillator 360 coupled to a clock input 351 of counter-decoder 350.

As seen in the state table of FIG. 9, when counter-decoder 350 is in state 1 wherein output A is a logical one and output B is a logical zero, then the reflection coefficient $\rho$ presented to coupling point 321 by reflection circuit 140 is equal to 1 at an angle of 180° as seen in the chart of FIG. 9. However, assuming the frequency $f_s$ of clock oscillator 360 equals 30 kHz, then 33.3 microseconds later counter-decoder circuit switches to state 2 wherein output A equals a logical zero and output B equals a logical one. Under these conditions, the reflection coefficient $\rho$ presented to coupling point 321 by reflection circuit 140 is equal to 1 at an angle of 60°. Another 33.3 microseconds later, as determined by $f_s$, state 3 commences (66.6 microseconds after the commencement of state 1) wherein counter-decoder circuit 350 exhibits a logical zero at output A and a logical zero at output B. Under these conditions, the reflection coefficient $\rho$ presented to coupling point 321 by reflection circuit 140 equals 1 at an angle of $-60°$ as seen in the chart of FIG. 9. At a point in time, 33.3 microseconds later, counter-decoder circuit 350 again commences the state 1 wherein output A equals 1 and output B equals logical zero. It is seen that states 1, 2, and 3 are repeated every 100 microseconds in accordance with the selected frequency $f_s$ of clock oscillator 360.

And now in more detail, the manner in which reflection network 140 cycles among the three aboved described impedance states each having angles 120° apart is discussed.

For sake of simplicity, the portion of the $f_c$ carrier signal coupled into reflection circuit 140 via coupler 300 is referred to as $V_r$ as it travels through the various elements comprising reflection circuit 140. The $V_r$ signal is affected by the changing reflection coefficient $\rho$ at coupling point 321 in the manner described above and shown in FIG. 9 every 33.3 microseconds in such a manner that the aforementioned lower side band signal at frequency $f_t$ is generated when the $V_r$ signal exits reflection circuit 140 and returns to line 130.

More specifically, when reflection circuit 140 is in state 1, that is, counter 350 output A exhibits a logical one and output B of counter 350 exhibits a logical zero, then diode 332 is turned on and exhibits 0 ohms or a short circuit. Thus, the $V_r$ signal travels from coupling point 321 over to diode 332 where it is completely and immediately reflected back to coupler 300. Thus, it is seen that under these conditions a reflection coefficient $\rho$ equal to 1 at an angle of 180° is exhibited to the $V_r$ signal. Since complete reflection of the $V_r$ signal occurred at diode 332, the $V_r$ signal did not travel via transmission line 320 to diode 342. Referring now to FIG. 10A, the corresponding voltage vector generated by reflection network 140 under the state 1 conditions are graphically displayed at the line designated state 1.

When reflection circuit 140 changes to state 2 such that counter-decoder 350 provides a logical zero to output A thereof and a logical one to output B thereof, diode 332 is turned off and exhibits a resistance of ∞ ohms while diode 342 is shorted and exhibits a resistance of 0 ohms. Thus under these conditions, the $V_r$ signal travels from coupler 300 to coupling point 321 through transmission line 320 to coupling point 322 and in so doing accrues $-60°$ of phase shift (the λ/6 length of transmission line between points 321 and 322 corresponds to $-60°$ of phase shift). Upon reaching connection point 322, the $V_r$ signal travels to shorted diode 342 which completely reflects the $V_r$ signal back to coupling point 322 resulting in an additional phase shift of $-180°$. The $V_r$ signal then travels along transmission line 320 from coupling point 322 to connection point 321 and accrues an additional $-60°$ of phase shift as it travels along this λ/6 distance. Thus, it is seen that the total phase shift experienced by the $V_r$ signal equals $-300°$ which corresponds to 60°. Therefore under the operating conditions of state 2 as shown in FIG. 9 and discussed above, a reflection coefficient $\rho$ of 1 at an angle of 60° is presented to the $V_r$ signal. The $V_r$ signal under such state 2 conditions is graphically depicted in FIG. 10A by the arrow designated state 2.

Under the state 3 operating conditions shown in FIG. 9 where counter-decoder 350 generates a logical zero at its output A and a logical zero at its output B, both diodes 332 and 342 are turned off and thus exhibit a resistance of ∞ ohms. Thus, the $V_r$ signal travels from coupler 300 to transmission line connection point 321 along transmission line 320 to transmission line connection point 322. While traveling along this distance, the $V_r$ signal is phased shifted by −60° (the λ/6 distance between points 321 and 322 on transmission line 320 corresponds to −60° of phase shift). Upon reaching coupling point 322, the phase shifted $V_r$ signal is phase shifted an additional −60° as it travels the λ/6 distance from coupling point 322 down to the end of the transmission line at coupling point 323. It is noted that coupling point 323 is shorted to ground and thus upon reaching such coupling point 323, the $V_r$ signal experiences an additional phase shift of −180°, that is, complete reflection back toward the opposite end of transmission line 320, namely toward coupling point 321 and coupler 300. As the $V_r$ signal travels back from the short at coupling point 323 to coupling point 322, the $V_r$ signal accrues an additional −60° of phase shift. Further, when the $V_r$ signal travels the remaining distance of transmission line 320 from coupling point 322 to coupling point 321, the $V_r$ signal accrues yet another −60° of phase shift. Thus, in total, as the $V_r$ signal travels down transmission line 320 to the short a coupling point 323 and back to coupling point 321 and coupler 300, such $V_r$ experiences a total phase shift of −420° which corresponds to a phase shift of −60°. Thus, under these state 3 operating conditions, the $V_r$ signal is subjected to a reflection coefficient ρ equal to 1 at an angle of −60° by reflection circuit 140. Such state 3 operation is represented by the arrow designated state 3 in FIG. 10A.

In FIG. 10A, it is noted that an arrow representing the carrier signal $f_c$ is drawn. As seen in FIG. 10A, it is noted that the $V_r$ signal is rotated through the three states (1, 2, and 3) in a clockwise manner as shown by the three curved arrows labeled 120°. However, it is noted that with respect to the $V_r$ signal which varies through these three states in a clockwise manner, the $f_c$ carrier signal rotates in an opposite, that is counter-clockwise, direction relative to the changing $V_r$ signal. This relative counter-clockwise rotation of the $f_c$ signal is designated by a curved line in the counter-clockwise direction drawn intercepting the $f_c$ line of FIG. 10A. Under these operating conditions wherein the $f_c$ carrier signal is rotating counter-clockwise relative to the clockwise rotation of the varying $V_r$ signals, a lower sideband signal is generated at a frequency $f_t$ as shown in FIG. 10B. Such lower sideband signal $f_t$ is by definition below carrier signal $f_c$. The frequency of the lower sideband signal $f_t$ equals $f_c - f_s/3$. To reiterate, $f_s$ equals the frequency at which reflection circuit 140 rotates among the three impedance states associated therewith shown both in FIG. 9 and graphically in FIG. 10A.

It is noted that if the direction of rotation among the three impedance states represented in FIG. 9 and FIG. 10A is changed from clockwise to counter-clockwise, that is, if impedance circuit 140 assumes state 3 first, then state 2 and then state 1 and so forth in repetition ad infinitum, then since both the $f_c$ carrier signal and the three impedance states associated with the $V_r$ signal are rotating counter-clockwise, both in the same direction, a resulting upper sideband signal will be generated on line 130 by action of reflection circuit 140. Such upper sideband signal is designated $f_t$ and is shown in FIG. 10C as exhibiting a frequency above that of carrier signal $f_c$. The frequency of upper sideband signal $f_t$ equals $f_c + f_s/3$.

Thus, in summary, reflection circuit 140 generates a tag signal $f_t$ sufficiently removed in frequency from the $f_c$ carrier signal to be distinguishable therefrom.

The foregoing describes adaptive radio frequency intermodulation minimizing apparatus which maximizes the amount of isolation achieved by a radio frequency circulator while minimizing the amount intermodulation distortion experienced by a radio frequency power amplifier.

Further, the foregoing describes an electronically variable impedance circuit for synthesizing various real or complex impedances whether inductive or capacitive in a selectable manner.

While only certain preferred features of the invention have been shown by way of illustration, many modifications and changes will occur through those skilled in the art. It is, therefore, to be understood that the present claims are intended to cover all such modifications and changes as fall within the true spirit of the invention.

What is claimed is:

1. A variable impedance network for providing a selectably variable input impedance to signals entering a port comprising:

transmission line means, having first and second ends, for conducting radio frequency energy, said first end being said port, said selectably variable input impedance being measurable at said first end, said second end being electrically coupled to a predetermined characteristic impedance;

first variable resistance means, electrically coupled via a first directional coupler to said transmission line means at a first coupling point, for varying the resistance presented to said transmission line means at said first coupling point in response to a first control signal, and second variable resistance means electrically coupled via a second directional coupler to said transmission line means at a second coupling point, for varying the resistance presented to said transmission line means at said second coupling point in response to a second control signal, said second point being situated between said first point and said characteristic impedance at a sufficient distance from said first point such that signals reflected by said second resistance means are in quadrature relationship with respect to signals reflected by said first resistance means at said first coupling point;

said first and second variable resistance means cooperating to cause different selected input impedances to be presented to signals at said port depending on the value of said first and second control signals provided to said first and second variable resistance means, respectively.

2. The impedance network of claim 1 wherein said first variable resistance means comprises a PIN diode.

3. The impedance network of claim 1 wherein said second variable resistance means comprises a PIN diode.

4. The impedance network of claim 2 wherein said second variable resistance means comprises a PIN diode.

5. The impedance network of claim 1 wherein the length of said transmission line between said first coupling point and said second coupling point is λ/8, wherein λ equals the wavelength of a signal comprising said radio frequency energy.

6. The impedance network of claim 4 wherein the length of said transmission line between said first coupling point and said second coupling point is λ/8, wherein λ equals the wavelength of a signal comprising said radio frequency energy.

* * * * *